United States Patent
Lee

(10) Patent No.: US 10,699,788 B2
(45) Date of Patent: Jun. 30, 2020

(54) NON-VOLATILE MEMORY DEVICE AND OPERATING METHOD THEREOF FOR PERFORMING AN ERASE DETECT OPERATION

(71) Applicant: Samsung Electronics Co., Ltd., Suwon-si, Gyeonggi-do (KR)

(72) Inventor: Ji-sang Lee, Iksan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 16/108,323

(22) Filed: Aug. 22, 2018

(65) Prior Publication Data

US 2019/0115081 A1  Apr. 18, 2019

(30) Foreign Application Priority Data

Oct. 12, 2017  (KR) .................... 10-2017-0132754

(51) Int. Cl.
| | | |
|---|---|---|
| *G11C 16/14* | (2006.01) | |
| *G11C 16/08* | (2006.01) | |
| *G11C 16/24* | (2006.01) | |
| *G11C 16/26* | (2006.01) | |
| *G11C 11/56* | (2006.01) | |
| *G11C 16/34* | (2006.01) | |

(Continued)

(52) U.S. Cl.
CPC .......... *G11C 16/14* (2013.01); *G11C 11/5628* (2013.01); *G11C 16/08* (2013.01); *G11C 16/10* (2013.01); *G11C 16/24* (2013.01); *G11C 16/26* (2013.01); *G11C 16/3445* (2013.01); *G11C 16/3459* (2013.01); *G11C 16/3468* (2013.01); *G11C 16/3472* (2013.01); *G11C 16/3481* (2013.01); *G11C 16/0483* (2013.01)

(58) Field of Classification Search
CPC .......... G11C 16/3495; G11C 29/56008; G06F 16/9024; G06F 11/073; G06F 11/0754; G06F 11/3485

See application file for complete search history.

(56) References Cited

U.S. PATENT DOCUMENTS

| | | | | |
|---|---|---|---|---|
| 6,498,752 B1 * | 12/2002 | Hsu | .......... | G11C 16/16 365/185.18 |
| 6,515,910 B1 * | 2/2003 | Lee | .......... | G11C 16/3404 365/185.09 |

(Continued)

FOREIGN PATENT DOCUMENTS

| | | |
|---|---|---|
| KR | 2009-0016945 A | 2/2009 |
| KR | 10-0972715 B1 | 7/2010 |

(Continued)

*Primary Examiner* — Gene N Auduong
(74) *Attorney, Agent, or Firm* — Harness, Dickey & Pierce, P.L.C.

(57) ABSTRACT

An operating method of a non-volatile memory device including a plurality of memory cells respectively connected to a plurality of word lines is provided. The operating method includes applying an erase detect voltage to a selected word line of the plurality of word lines to perform an erase detect operation on memory cells connected to the selected word line in response to a program command, applying a program voltage to the selected word line after the erase detect operation, and counting a number of underased cells of the memory cells on which the erase detect operation has been performed.

20 Claims, 34 Drawing Sheets

(51) Int. Cl.
    *G11C 16/10*     (2006.01)
    *G11C 16/04*     (2006.01)

(56)            References Cited

U.S. PATENT DOCUMENTS

| | | |
|---|---|---|
| 7,251,160 B2 | 7/2007 | Li et al. |
| 7,679,133 B2 | 3/2010 | Son et al. |
| 8,050,101 B2 | 11/2011 | Park et al. |
| 8,054,684 B2 | 11/2011 | Gorobets et al. |
| 8,254,181 B2 | 8/2012 | Hwang et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,502,128 B2 | 11/2016 | Lee |
| 2004/0160829 A1* | 8/2004 | Tsujikawa ............ G11C 11/5621 365/185.28 |
| 2004/0210729 A1* | 10/2004 | Horii ..................... G11C 7/1042 711/156 |
| 2011/0233648 A1 | 9/2011 | Seol et al. |
| 2016/0231953 A1 | 8/2016 | Lee et al. |
| 2017/0162266 A1 | 6/2017 | Seol et al. |
| 2017/0178740 A1 | 6/2017 | Kim et al. |
| 2017/0206030 A1 | 7/2017 | Woo et al. |

FOREIGN PATENT DOCUMENTS

| | | |
|---|---|---|
| KR | 2011-0001067 A | 1/2011 |
| KR | 10-1532754 B1 | 7/2015 |

* cited by examiner

NON-VOLATILE MEMORY DEVICE AND OPERATING METHOD THEREOF FOR PERFORMING AN ERASE DETECT OPERATION

CROSS-REFERENCE TO RELATED APPLICATION

This application claims the benefit of Korean Patent Application No. 10-2017-0132754, filed on Oct. 12, 2017, in the Korean Intellectual Property Office, the disclosure of which is incorporated herein in its entirety by reference.

BACKGROUND

Inventive concepts relate to a memory device, and more particularly, to a non-volatile memory device and an operating method thereof, which detect and repair a defective word line.

Memory devices may be used to store data and may be categorized into non-volatile memory devices and volatile memory devices. As an example of non-volatile memory devices, flash memory devices may be applied to portable phones, digital cameras, personal digital assistants (PDAs), mobile computer devices, fixed computer devices, and/or other devices. Recently, as information communication devices are being equipped with multiple functions, large-capacity and highly integrated memory devices are desired.

SUMMARY

Inventive concepts provide a non-volatile memory device and an operating method thereof.

According to some example embodiments of inventive concepts, there is provided an operating method of a non-volatile memory device including a plurality of memory cells respectively connected to a plurality of word lines, the operating method including applying an erase detect voltage to a selected word line of the plurality of word lines to perform an erase detect operation on memory cells connected to the selected word line in response to a program command, applying a program voltage to the selected word line after the erase detect operation, and counting a number of undererased cells of the memory cells on which the erase detect operation has been performed.

According to some example embodiments of inventive concepts, there is provided an operating method of a non-volatile memory device including a plurality of memory cells respectively connected to a plurality of word lines, the operating method including applying a program voltage to a selected word line of the plurality of word lines in response to a program command, applying an erase detect voltage to the selected word line to perform an erase detect operation on program-inhibited memory cells of memory cells connected to the selected word line after the applying of the program voltage, and counting a number of undererased cells of the program-inhibited memory cells on which the erase detect operation has been performed.

According to some example embodiments of inventive concepts, there is provided an operating method of a non-volatile memory device including a plurality of memory cells respectively connected to a plurality of word lines, the operating method including applying a program voltage to a selected word line of the plurality of word lines in response to a program command, performing a program verify operation on programmed memory cells of memory cells connected to the selected word line by using a program verify voltage, performing an erase detect operation on program-inhibited memory cells of the memory cells connected to the selected word line by using the program verify voltage, and counting a number of undererased cells of the program-inhibited memory cells on which the erase detect operation has been performed.

According to some example embodiments of inventive concepts, there is provided a non-volatile memory device including a memory cell array including a plurality of memory cells respectively connected to a plurality of word lines, a page buffer unit including a plurality of page buffers respectively connected to memory cells connected to a selected word line of the plurality of word lines and configured to respectively store erase detect results of the memory cells before or in the middle of performing a program operation on the selected word line, and a counter connected to the plurality of page buffers and configured to count a number of undererased cells from the erase detect results.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

The various operations of methods described above may be performed by any suitable means capable of performing the operations, such as various hardware, circuits, and/or module(s). The blocks or steps of a method or algorithm and functions described in connection with the embodiments disclosed herein may be embodied directly in hardware.

Hereinafter, embodiments will be described in detail with reference to the accompanying drawings.

Figure 1:
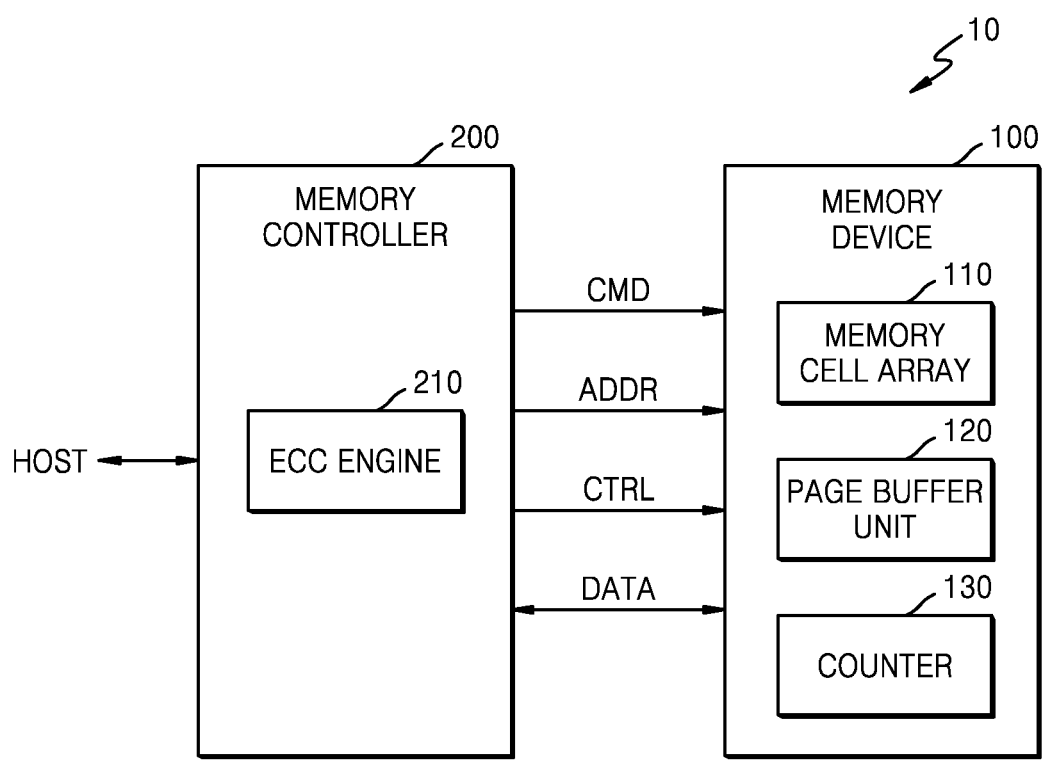
FIG. 1 is a block diagram illustrating a memory system according to an embodiment.

FIG. 1 is a block diagram illustrating a memory system 10 according to an embodiment.

Referring to FIG. 1, the memory system 10 may include a memory device 100 and a memory controller 200. The memory device 100 may be, or may include, a non-volatile memory device and may be implemented as a memory chip. The memory device 100 may include a memory cell array 110, a page buffer unit 120, and a counter 130. In some example embodiments, the memory system 10 may be implemented with an internal memory embedded into an electronic device, and for example, may be, or may include, an embedded universal flash storage (UFS) memory device, embedded multi-media card (eMMC), or solid state drive (SSD). In some example embodiments, the memory system 10 may be implemented with an external memory attachable/detachable on/from an electronic device, and for example, a UFS memory card, compact flash (CF), secure digital (SD), micro secure digital (Micro-SD), mini secure digital (Mini-SD), extreme digital (xD), or memory stick.

In response to a read/write request from a host HOST, the memory controller 200 may control the memory device 100 to read data stored in the memory device 100 or program data in the memory device 100. In detail, the memory controller 200 may provide a command CMD, an address ADDR, and a control signal CTRL to the memory device 100 to control a program operation, a read operation, and an erase operation on the memory device 100. Also, data DATA to program and read data DATA may be transmitted or received between the memory controller 200 and the memory device 100. The memory controller 200 may include an error correcting code (ECC) engine 210, and the ECC engine 210 may correct an error in data received from the memory device 100.

The memory cell array 110 may include a plurality of memory cells, and for example, the plurality of memory cells may be flash memory cells. Hereinafter, an example where the plurality of memory cells are flash memory cells will be described. However, the embodiment is not limited thereto. In other embodiments, the plurality of memory cells may be resistive memory cells such as resistive random access memory (ReRAM), phase change random access memory (PRAM), or magnetic random access memory (MRAM). In some example embodiments, the memory cell array 110 may include a two-dimensional (2D) memory cell array. In some example embodiments, the memory cell array 110 may include a three-dimensional (3D) memory cell array including a plurality of NAND strings, as described below with reference to FIGS. 4 and 5.

The 3D memory cell array may be or may include a circuit that includes an active area disposed on a silicon substrate and is associated with an operation of each of memory cells, and may be configured in a monolithic type on a physical level of at least one of memory cell arrays each including a circuit which is provided on or in the substrate. The monolithic type may denote that layers of levels configuring an array are stacked just on layers of lower levels of the array. In an embodiment, the 3D memory cell array may include a plurality of NAND strings which are arranged in a vertical direction in order for at least one memory cell to be disposed on another memory cell. The at least one memory cell may include a charge trap layer. U.S. Pat. Nos. 7,679,133, 8,553,466, 8,654,587 and 8,559,235 and U.S. Patent Application No. 2011/0233648 disclose appropriate elements of a 3D memory cell array which include a plurality of levels and in which word lines and/or bit lines are shared between the plurality of levels. In the specification, the above reference documents are incorporated herein by reference in their entirety.

The page buffer unit 120 may store an erase detect result of each of memory cells and may output page buffer signals based on the stored erase detect result. In an embodiment, the erase detect result may correspond to a voltage of each of sensing nodes respectively connected to bit lines when an erase detect voltage is applied to a selected word line, in a program operation. In an embodiment, the erase detect voltage may be lower than a verify voltage (for example, Vvfy1 of FIG. 6A) having a lowest program state for memory cells. In an embodiment, the erase detect voltage may be the same as the verify voltage having the lowest program state for the memory cells, and a develop time of sensing nodes connected to memory cells on which erase detect is to be performed may be shorter than a develop time of sensing nodes connected to programmed memory cells.

The counter 130 may receive the page buffer signals from the page buffer unit 120, and may count the number of off, or undererased, cells, based on the received page buffer signals. In this case, a threshold voltage of each of the undererased cells may be greater than the erase detect voltage. In an embodiment, the undererased cells may correspond to memory cells on which an erase operation is not normally performed. An undererased cell may be a cell that, after an erase operation applied to the cell, still has a threshold voltage greater than the erase detect voltage. In an embodiment, the undererased cells may correspond to memory cells where the erase operation has been normally performed but a threshold voltage has increased due to program disturbance.

If the counted number of the undererased cells is greater than a reference bit count, a selected word line may be determined as a defective word line. At this time, the memory device 100 may end a program operation on memory cells connected to the defective word line and may process the memory cells connected to the defective word line as a fail block. In an embodiment, the memory device 100 may provide a fail message to the memory controller 200. In an embodiment, the memory device 100 may provide a comparison result, obtained by comparing the counted number of the undererased cells with the reference bit count, to the memory controller 200. If the counted number of the undererased cells is less than or equal to the reference bit count, the memory device 100 may not determine the selected word line as the defective word line. At this time, the memory device 100 may continuously perform the program operation on memory cells connected to the selected word line.

Figure 2A:
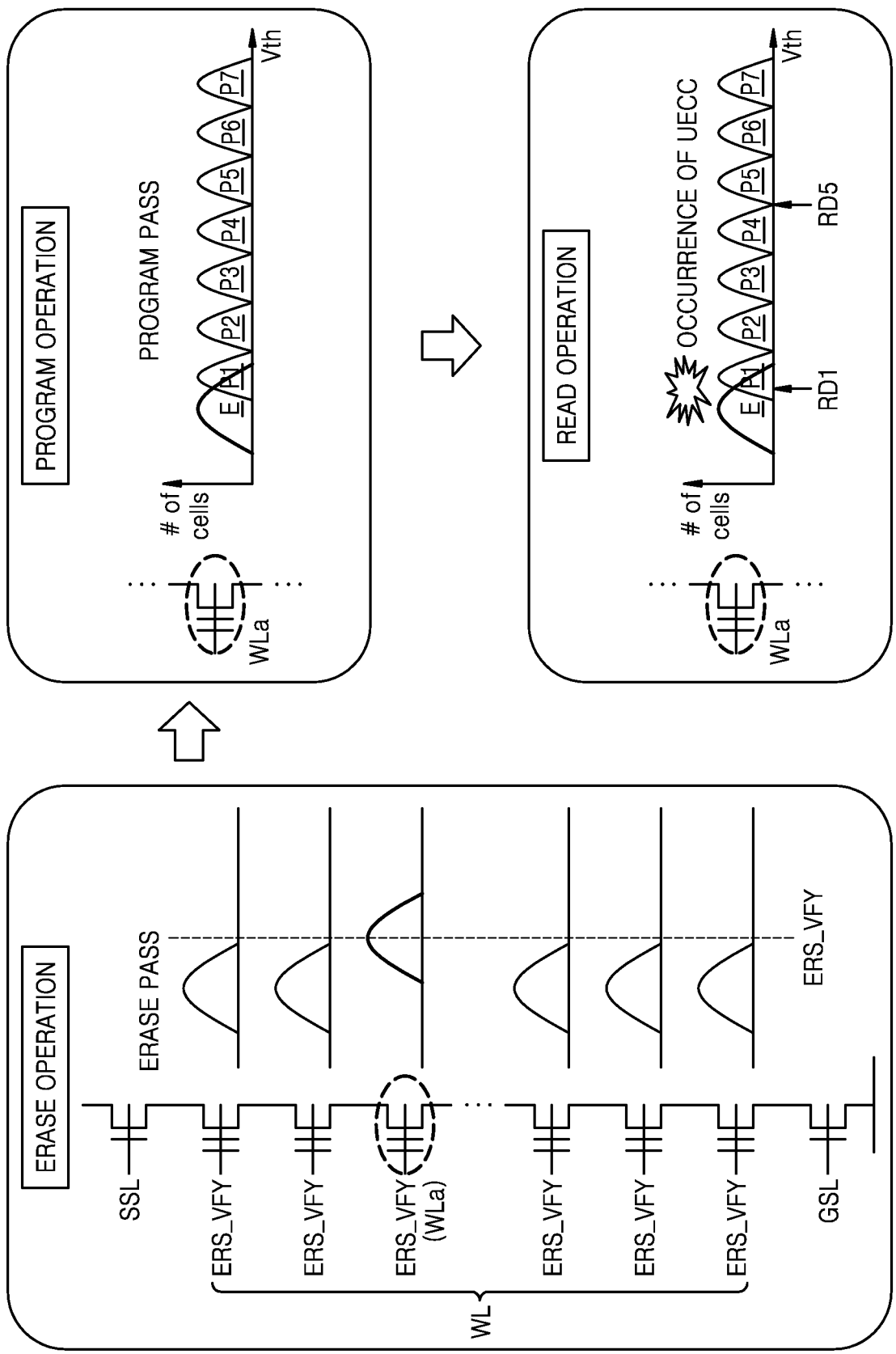
FIGS. 2A and 2B illustrate examples of an operation of a memory device including a defective word line.

FIG. 2A illustrates an example of an operation of a memory device including a defective word line. Referring to FIG. 2A, an erase operation may be performed on the memory device, and then, by applying an erase verify voltage ERS_VFY to word lines WL, an erase verify operation may be performed. A defective word line WLa of the word lines WL may occur due to deterioration of the memory device and/or a process error caused by an increase in program/erase cycle. At this time, the erase operation may not be normally performed on memory cells connected to the defective word line WLa, and a threshold voltage of each of the memory cells connected to the defective word line WLa may not be sufficiently lowered to the erase verify voltage ERS_VFY or less.

If an erase verify operation is performed on the word lines WL, a precise erase verify result is obtained, but as the number of the word lines WL increases, the number of erase verifications increases, which may cause an excessive increase in time taken in the erase verify operation. Therefore, by simultaneously applying the erase verify voltage ERS_VFY to the word lines WL, the erase verify operation may be simultaneously performed on the word lines WL, or the word lines WL may be divided into two or more groups, and the erase verify operation may be performed on each of two or more groups. In this case, a time taken in the erase verify operation is reduced, but an accuracy of an erase verify result may be reduced. For example, the memory cells connected to the defective word line WLa are not normally erased, but may be recognized as an erase pass according to the erase verify result.

In a case where a program operation is performed on the memory cells connected to the defective word line WLa after the erase pass, memory cells which are not normally erased may be programmed to first to seventh program states P1 to P7, and a program operation may be passed according to a program verify result. For example, cells in the program state P5 may have a threshold voltage greater than RD5. In a case where a read operation is performed on the memory cells connected to the defective word line WLa after the program pass, a read error may occur due to an abnormal threshold voltage distribution of memory cells where a target state is an erase state E. For example, cells in the erased state E may overlap with cells in the program state P1, and a voltage of RD1 may not distinguish cells in the erased state E over cells in the program state P1. In detail, an uncorrectable read error (i.e., an uncorrectable ECC) may occur due to an ECC engine (for example, 210 of FIG. 1) included in a memory controller (for example, 200 of FIG. 1).

Figure 2B:
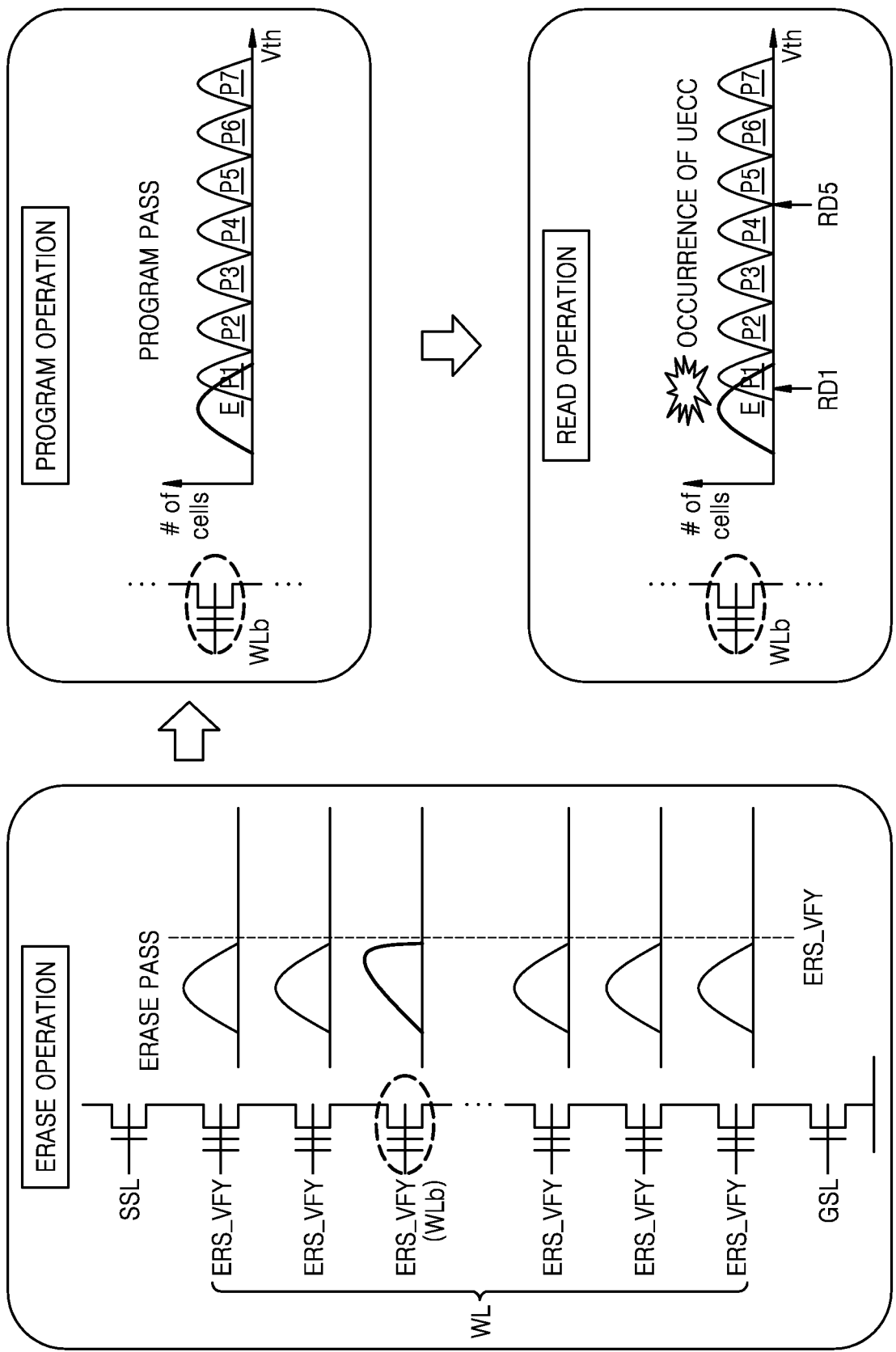

FIG. 2B illustrates an example of an operation of a memory device including a defective word line. Referring to FIG. 2B, based on a result of an erase operation on the memory device, threshold voltages of memory cells connected to a word line WLb of a plurality of word lines WL may be very close to an erase verify voltage ERS_VFY. However, the threshold voltages of the memory cells connected to the word line WLb may be lower than the erase verify voltage ERS_VFY, and thus, an erase pass may be performed according to the result of the erase operation on the memory device. In a case where a program operation is performed on memory cells connected to word lines adjacent to the word line WLb after the erase pass, threshold voltages of some of the memory cells connected to the word line WLb may increase to the erase verify voltage ERS_VFY or higher due to program disturbance. In this manner, a progressive defect where a threshold voltage increases due to program disturbance may occur in memory cells on which the erase operation has been normally performed.

When the progressive defect occurs, as described above with reference to FIG. 2A, the memory cells connected to the word line WLb may be programmed to first to seventh program states P1 to P7, and a program operation may be passed according to a program verify result. For example, cells in the erased state E may overlap with cells in the program state P1, and a voltage of RD1 may not distinguish cells in the erased state E over cells in the program state P1. In a case where a read operation is performed on the memory cells connected to the word line WLb after the program pass, a read error may occur due to an abnormal threshold voltage distribution of memory cells where a target state is an erase state E.

Figure 3:
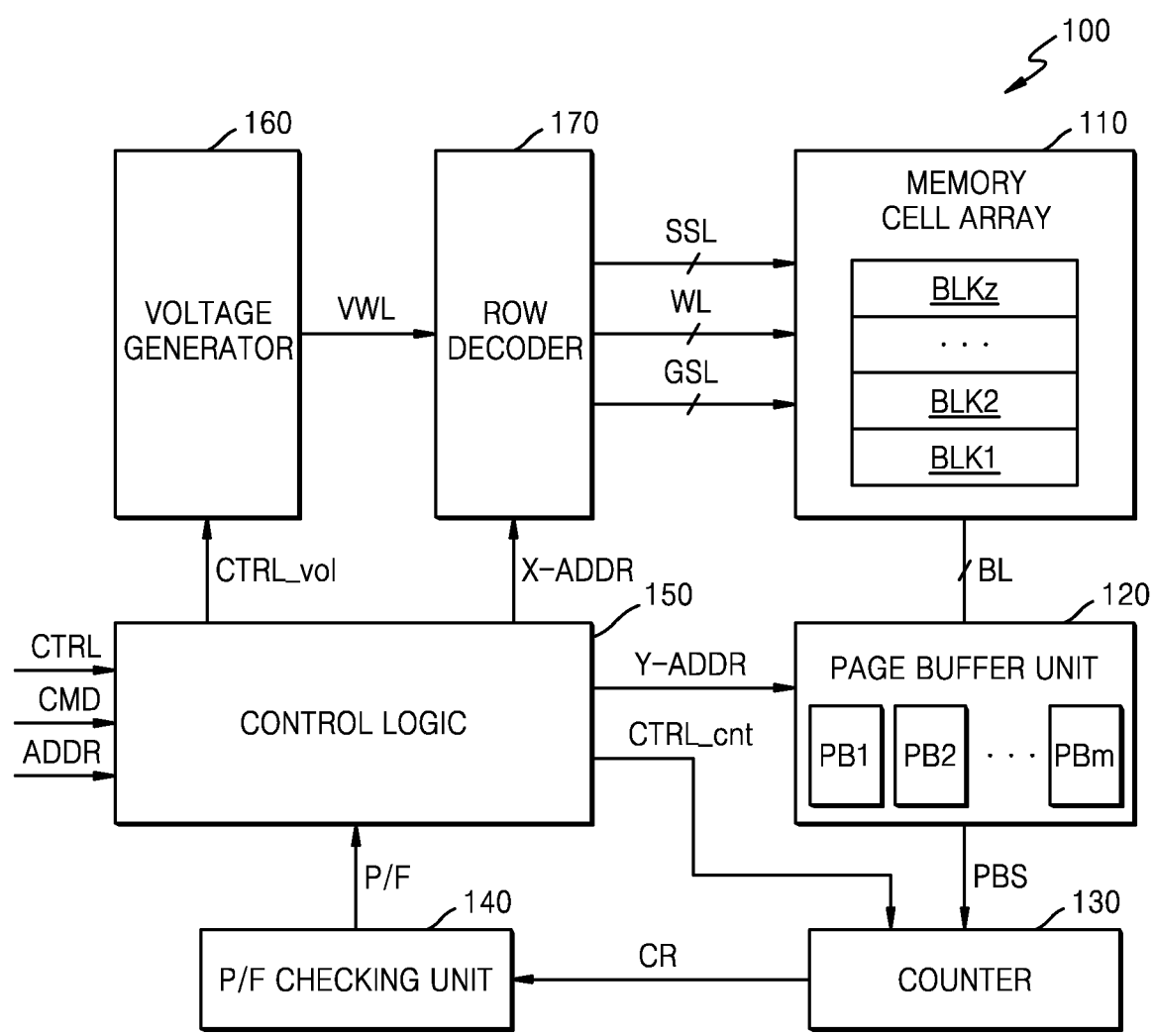
FIG. 3 is a block diagram illustrating a memory device according to an embodiment.

FIG. 3 is a block diagram illustrating a memory device 100 according to an embodiment. Referring to FIG. 3, the memory device 100 may include a memory cell array 110, a page buffer unit 120, a counter 130, a pass/fail (P/F) checking unit 140, a control logic 150, a voltage generator 160, and/or a row decoder 170. Although not shown, the memory device 100 may further include a data input/output (I/O) circuit or an I/O interface.

The memory cell array 110 may be connected to the page buffer unit 120 through bit lines BL and may be connected to the row decoder 170 through word lines WL, string selection lines SSL, and ground selection lines GSL. The memory cell array 110 may include a plurality of memory blocks BLK1 to BLKz, and each of the memory blocks BLK1 to BLKz may include a plurality of memory cells. Each of the memory cells may store one or more bits, and in detail, each of the memory cells may be used as a single level cell (SLC), a multi-level cell (MLC), or a triple level cell (TLC). In an embodiment, some of the memory blocks BLK1 to BLKz may be SLC blocks, and the other memory blocks may be MLC blocks or TLC blocks.

The page buffer unit 120 may include a plurality of page buffers PB1 to PBm (where m is an integer greater than or equal to two). In an embodiment, each of the page buffers PB1 to PBm may be connected to one bit line. In an embodiment, each of the page buffers PB1 to PBm may be connected to one bit line group, and a plurality of bit lines included in one bit line group may share one page buffer. For example, four bit lines may configure one bit line group and may share one page buffer. The counter 130 may count the number of undererased cells to generate a count result CR, based on a page buffer signal PBS. In this case, threshold voltages of the undererased cells may be higher than an erase detect voltage. The P/F checking unit 140 may determine whether a program operation is passed on memory cells, based on the count result CR, thereby generating a pass signal or a fail signal P/F.

The control logic 150 may output various control signals for writing data in the memory cell array 110 or reading the data from the memory cell array 110, based on a command CMD, an address ADDR, and/or a control signal CTRL. Therefore, the control logic 150 may overall control various operations of the memory device 100. In detail, the control logic 150 may provide a voltage control signal CTRL_vol to the voltage generator 160, provide a row address X_ADDR to the row decoder 170, provide a column address Y-ADDR to the page buffer unit 120, and provide a counting control signal CTRL_cnt to the counter 130.

The voltage generator 160 may generate various kinds of voltages for performing a program operation, a read operation, and an erase operation on the memory cell array 110, based on the voltage control signal CTRL_vol. In more detail, the voltage generator 160 may generate a word line voltage VWL, for example, a program voltage, a read voltage, a pass voltage, an erase verify voltage, or a program verify voltage. Also, the voltage generator 160 may further generate a string selection line voltage and a ground selection line voltage, based on the voltage control signal CTRL_vol. Also, the voltage generator 160 may further generate an erase voltage which is to be supplied to the memory cell array 110.

In response to the row address X_ADDR, the row decoder 170 may select one memory block from among the memory blocks BLK1 to BLKz, select one word line from among word lines WL of the selected one memory block, and select one string selection line from among a plurality of string selection lines SSL. The page buffer unit 120 may select some bit lines from among a plurality of bit lines BL in response to the column address Y-ADDR. In more detail, the page buffer unit 120 may operate as a write driver or a sensing amplifier according to an operation mode.

Figure 4:
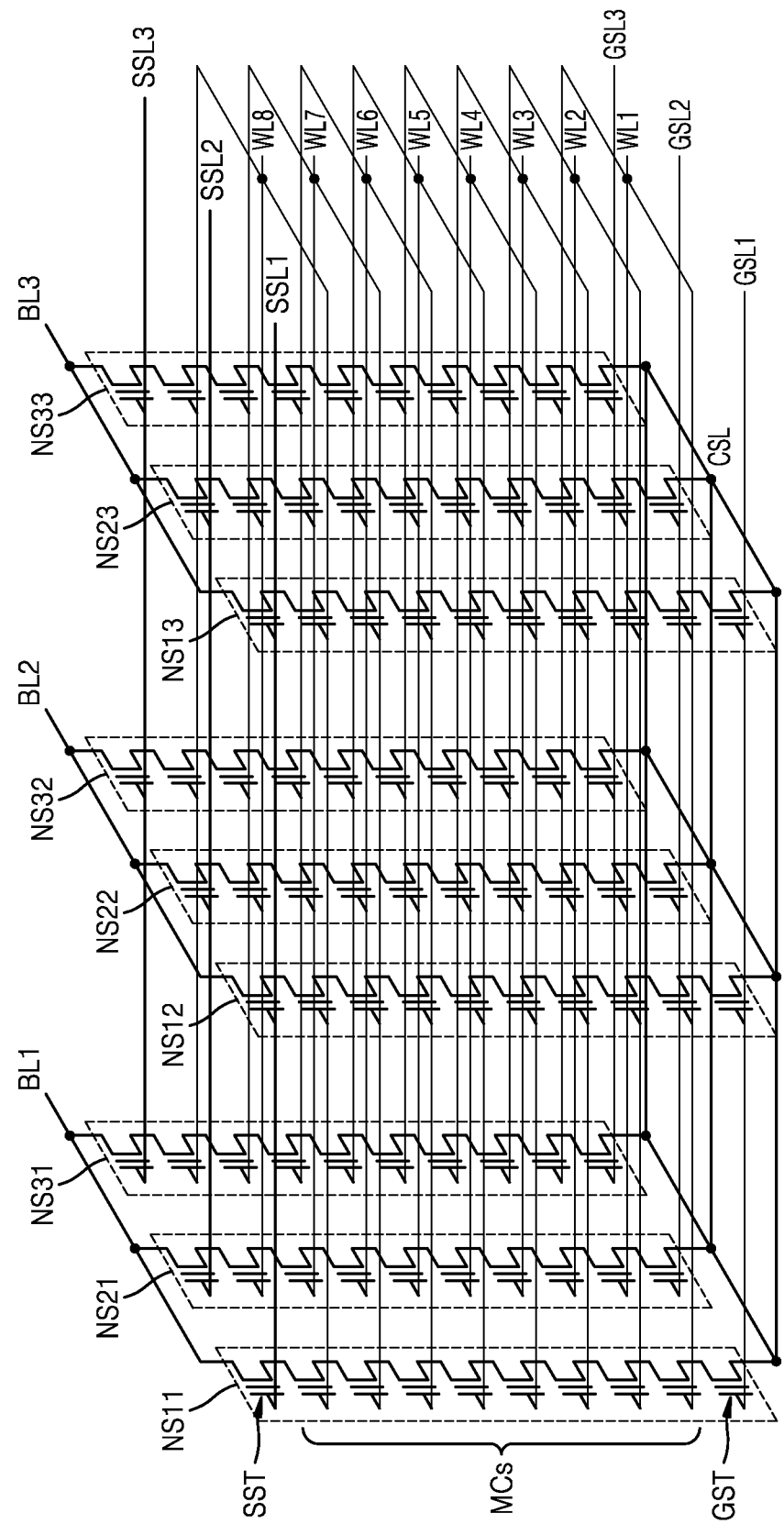
FIG. 4 illustrates an equivalent circuit diagram of a first memory block of FIG. 3.

FIG. 4 illustrates an equivalent circuit diagram of a first memory block BLK1 of FIG. 3.

Referring to FIG. 4, the first memory block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Each (for example, NS11) of the NAND strings may include a string selection transistor SST, a plurality of memory cells MC, and a ground selection transistor GST. The string selection transistor SST may be connected to the string selection lines SSL1 to SSL3 corresponding thereto. Each of the plurality of memory cells MC may be connected to the word lines WL1 to WL8 corresponding thereto. The ground selection transistor GST may be connected to the ground selection lines GSL1 to GSL3 corresponding thereto. The string selection transistor SST may be connected to the bit lines BL1 to BL3 corresponding thereto, and the ground selection transistor GST may be connected to the common source line CSL.

Figure 5:
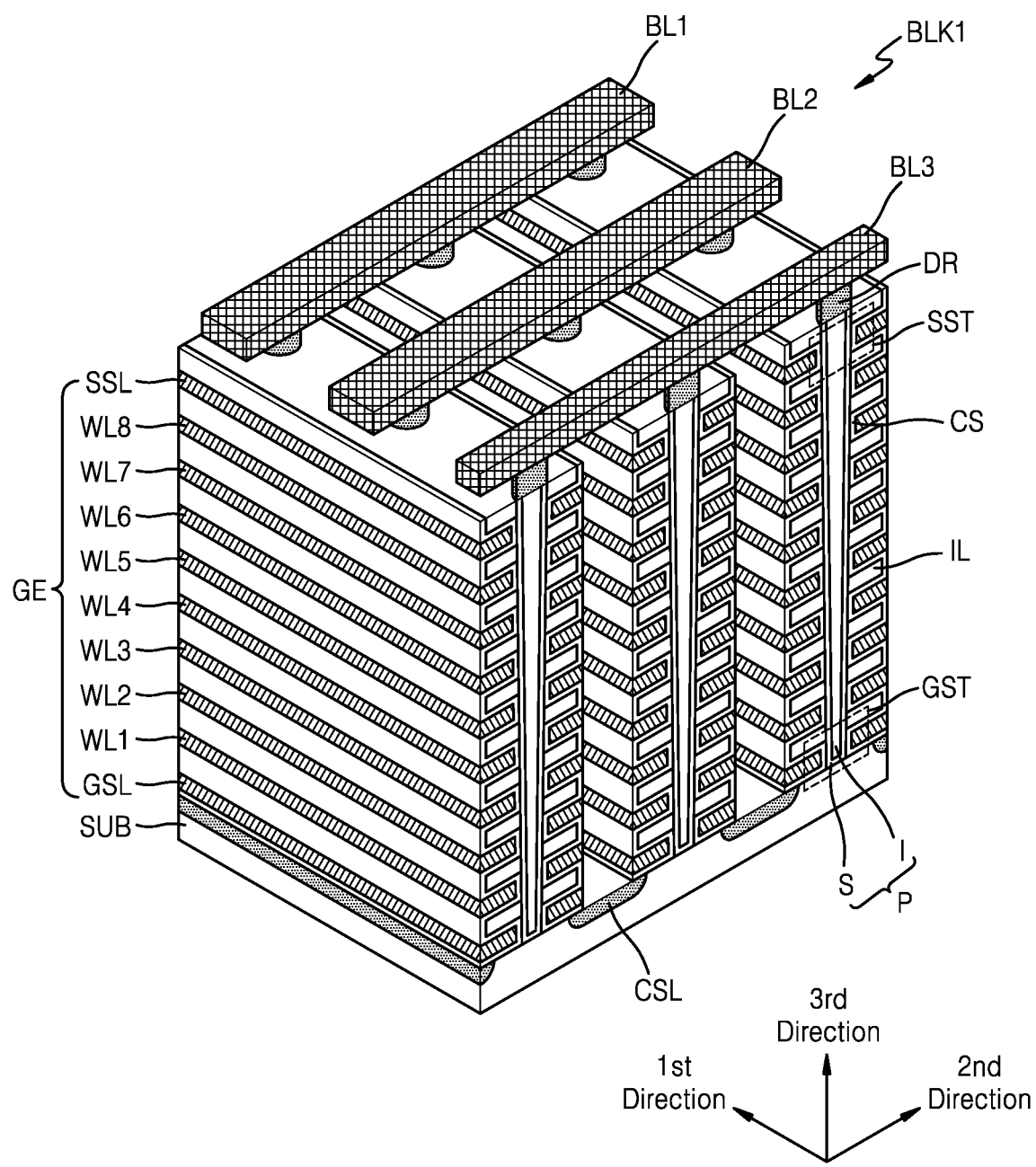
FIG. 5 is a perspective view illustrating the first memory block of FIG. 3.

FIG. 5 is a perspective view illustrating the first memory block BLK1 of FIG. 3.

Referring to FIG. 5, the first memory block BLK1 may be provided in a vertical direction with respect to a substrate SUB. The substrate SUB may be of a first conductivity type (for example, a p-type), and the common source line CSL which extends in a first direction and is doped with impurities of a second conductivity type (for example, an n-type) may be provided on the substrate SUB. A plurality of insulation layers IL extending in the first direction may be sequentially provided in a third direction in a region of the substrate SUB between two adjacent common source lines CSL, and may be spaced apart from each other by a certain distance in the third direction.

A plurality of pillars P, which are sequentially arranged in the first direction and pass through the plurality of insulation layers IL in the third direction, may be provided in a region of the substrate SUB between two adjacent common source lines CSL. For example, the plurality of pillars P may contact the substrate SUB through the plurality of insulation layers IL. In more detail, a surface layer S of each of the pillars P may include a silicon material of a first conductivity type and may function as a channel region. An internal layer I of each pillar P may include an air gap or an insulating material such as silicon oxide.

The insulation layers IL, the pillars P, and a charge storage layer CS provided along an exposed surface of the substrate SUB may be provided in a region of the substrate SUB between two adjacent common source lines CSL. The charge storage layer CS may include a tunneling insulation layer, a charge trap layer, and a blocking insulation layer. Also, a gate electrode GE including the selection lines GSL and SSL and the word lines WL1 to WL8 may be provided on an exposed surface of the charge storage layer CS and in a region of the substrate SUB between two adjacent common source lines CSL. A plurality of drains or drain contacts DR may be respectively provided on the plurality of pillars P. For example, the drains or drain contacts DR may include a silicon material doped with impurities of the second conductivity type. The bit lines BL1 to BL3, which extend in the second direction and are spaced apart from each other by a certain distance in the first direction, may be provided on the drains DR.

Figure 6A:
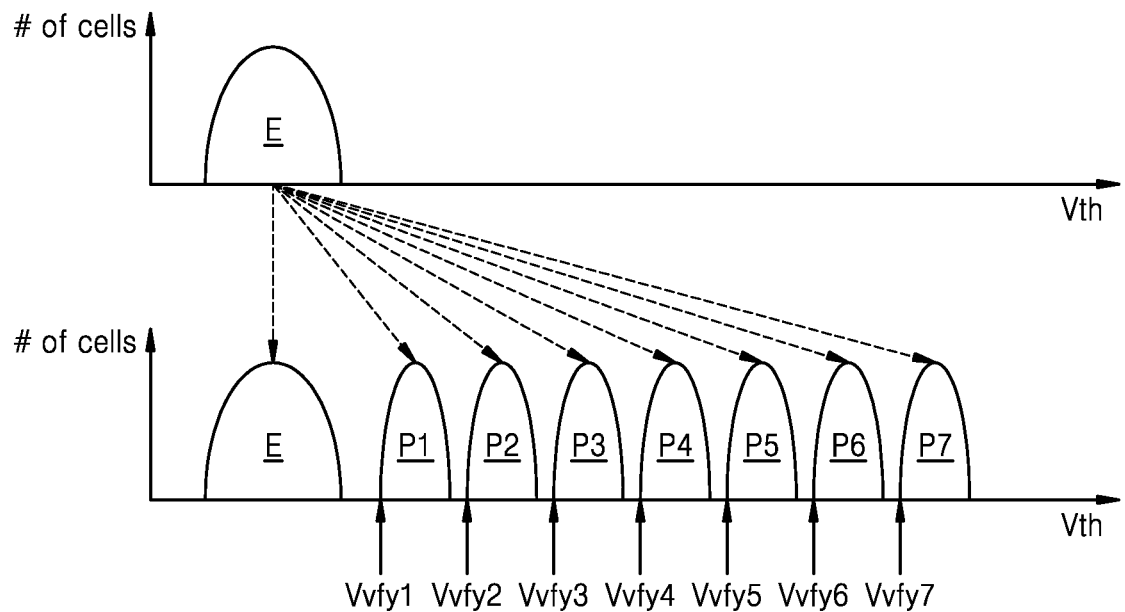
FIG. 6A illustrates a threshold voltage distribution of memory cells of FIG. 4.
Figure 6B:
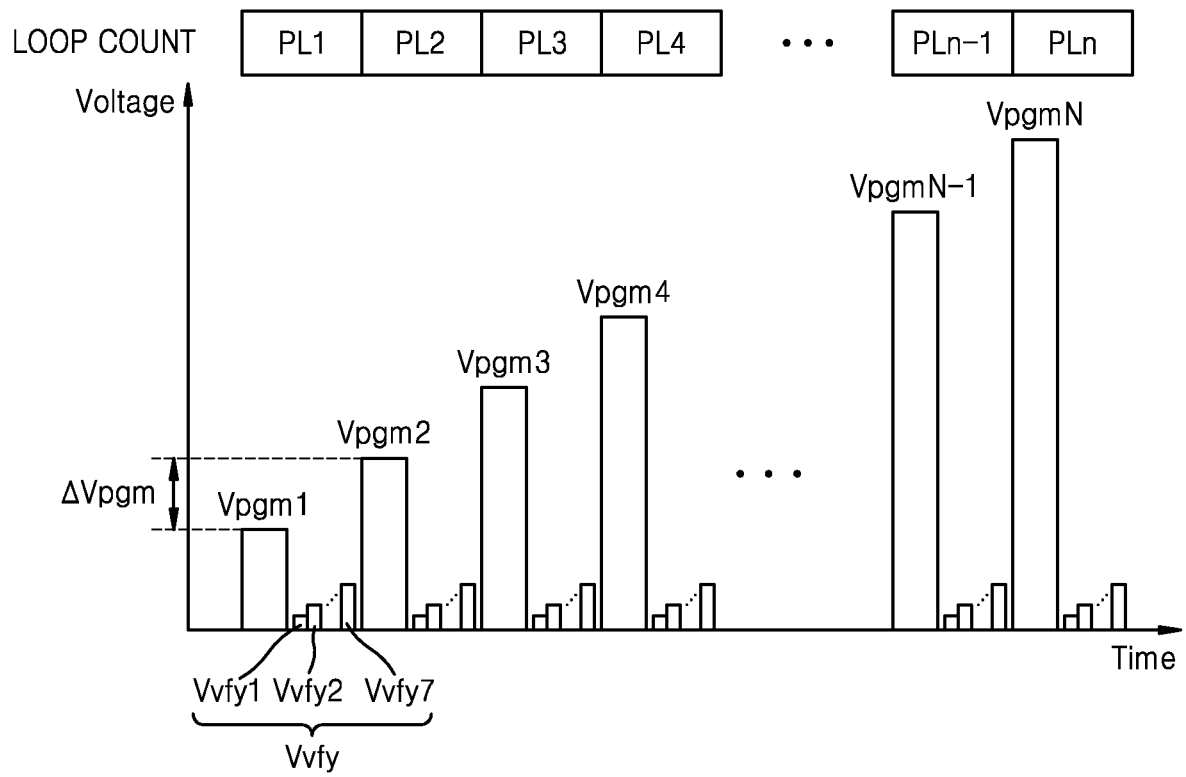
FIG. 6B illustrates a program method of forming the threshold voltage distribution of FIG. 6A.

FIG. 6A illustrates a threshold voltage distribution of memory cells of FIG. 4, and FIG. 6B illustrates a program method of forming the threshold voltage distribution of FIG. 6A. Referring to FIG. 6A, the abscissa axis represents a threshold voltage Vth, and the ordinate axis represents the number of memory cells. In an embodiment, each of memory cells may be a TLC, and memory cells having an erase state may be programmed to have a state corresponding to one of first to seventh program states P1 to P7 and an erase state E. In an embodiment, each of the memory cells may be an MLC, and the memory cells having the erase state may be programmed to have a state corresponding to one of the first to third program states P1 to P3 and the erase state E. In an embodiment, each of the memory cells may be an SLC, and the memory cells having the erase state may be programmed to have the erase state E or the first program state P1.

Referring to FIG. 6B, the memory device may perform a plurality of program loops PL1 to PLn (where n is an integer greater than or equal to two) to program the memory cells in order for the memory cells to have one of the first to seventh program states P1 to P7 and the erase state E. Each of the program loops PL1 to PLn may include a program process of applying program pulses Vpgm1 to VpgmN and a verify process of applying verify voltages Vvfy1 to Vvfy7. In a first program loop PL1, a first program pulse Vpgm1 may be applied to a selected word line, and subsequently, the verify voltages Vvfy1 to Vvfy7 may be sequentially applied to the selected word line. Memory cells on which a verify pass has been performed based on the verify voltages Vvfy1 to Vvfy7 may be determined as having a target program state, and in a second program loop PL2, programming may be inhibited. The verify pass may denote that a memory cell is read out as an undererased cell, based on a corresponding verify voltage. In the second program loop PL2, in order to program memory cells other than program-inhibited memory cells, a second program pulse with a voltage Vpgm2 greater than the voltage Vpgm1 of the first program pulse by an increased program voltage level ΔVpgm may be applied, and then, a verify operation may be performed identically to a verify process of the first program loop PL1.

Figure 7:
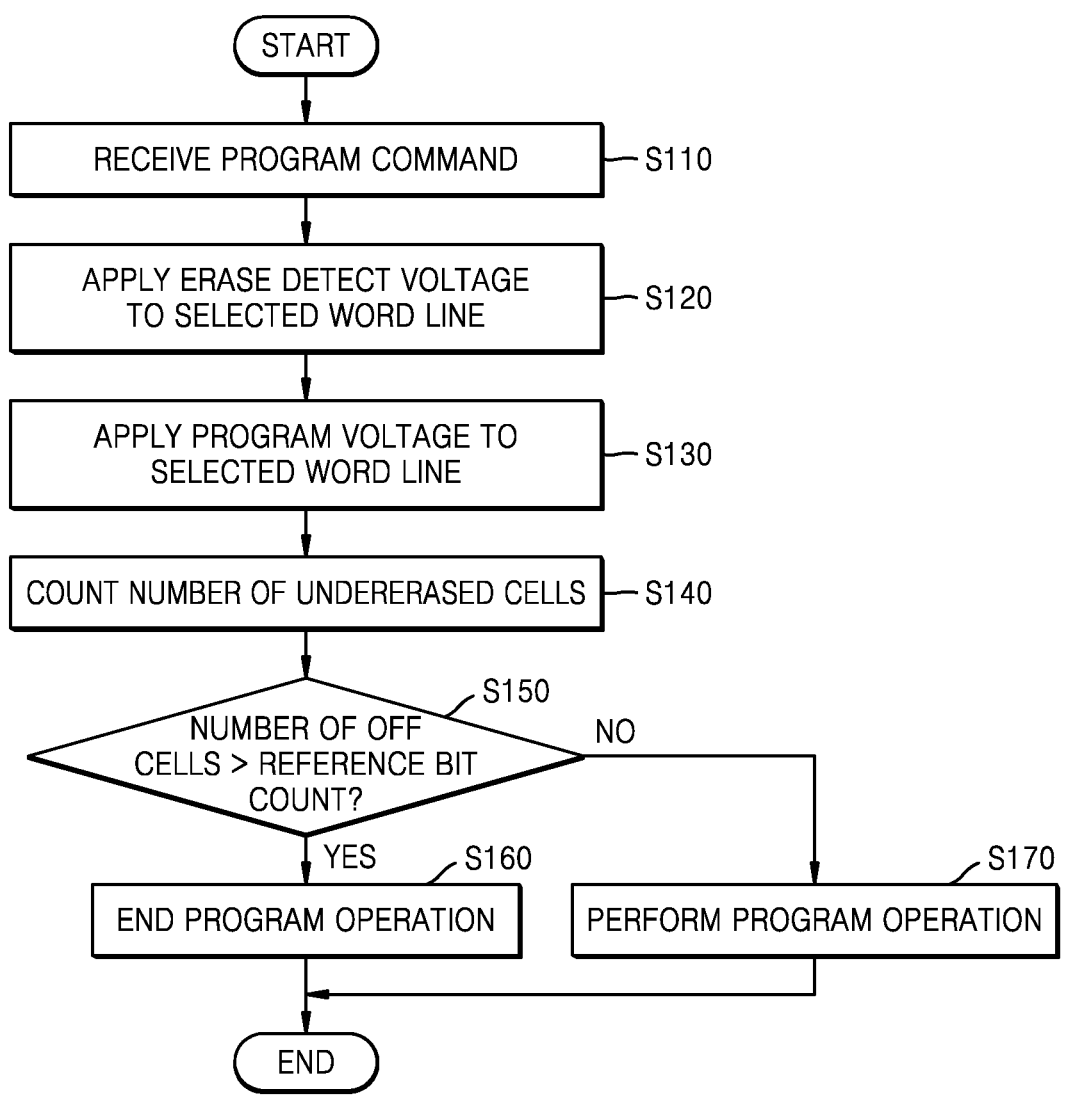
FIG. 7 is a flowchart illustrating an operating method of a memory device according to an embodiment.

FIG. 7 is a flowchart illustrating an operating method of a memory device according to an embodiment. Referring to FIG. 7, the operating method according to an embodiment may perform an erase detect operation in performing a program operation of the memory device, and thus, may correspond to a method of checking a defective word line, and for example, may include processes which are time-serially performed by the memory device 100 of FIG. 3. Description given above with reference to FIGS. 1 to 6B may be applied to the embodiment.

In operation S110, the memory device 100 may receive a program command CMD. For example, the memory device 100 may receive the program command CMD from the memory controller 200. Also, the memory device 100 may further receive an address ADDR and data from the memory controller 200. In this manner, an erase detect operation for checking a defective word line may be performed after the program command is received, and the memory device 100 may perform an erase verify operation in performing a program operation.

In operation S120, by applying an erase detect voltage to a selected word line, the erase detect operation may be performed on memory cells connected to the selected word line. For example, the row decoder 170 may apply the erase detect voltage to the selected word line, corresponding to the address ADDR, of the plurality of word lines WL. In an embodiment, a voltage level of the erase detect voltage may be lower than a verify voltage (for example, Vvfy1 of FIG. 6A) having a lowest program state for memory cells. In an embodiment, the voltage level of the erase detect voltage may be greater than a verify voltage level (for example, ERS_VFY of FIG. 2) having an erase state for memory cells.

In operation S130, a program voltage may be applied to the selected word line. For example, the row decoder 170 may apply a first program pulse (for example, Vpgm1) to the selected word line, corresponding to the address ADDR, of the plurality of word lines WL. In operation S140, the memory device 100 may count the number of undererased cells of the memory cells on which the erase detect operation has been performed. In an embodiment, operation S130 and operation S140 may be performed substantially simultaneously. However, the embodiment is not limited thereto, and in some example embodiments, operation S140 may be performed after operation S130. Also, in some example embodiments, operation S130 may be performed after operation S140. Hereinafter, operation S140 will be described in more detail with reference to FIG. 8.

Figure 8:
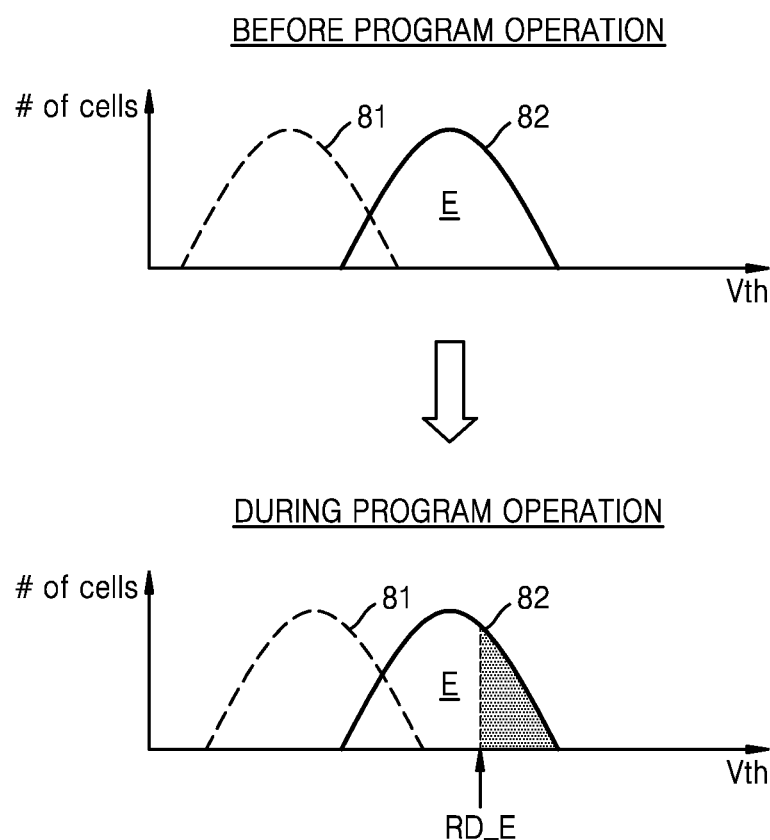
FIG. 8 illustrates a threshold voltage distribution of memory cells based on the operating method of FIG. 7.

FIG. 8 illustrates a threshold voltage distribution of memory cells based on the operating method of FIG. 7.

Referring to FIG. 8, before a program operation, memory cells connected to a normal word line may have a normal erase state 81, and memory cells connected to a defective word line may have an abnormal erase state 82. Threshold voltages of the memory cells having the abnormal erase state 82 may be greater than those of the memory cells having the normal erase state 81. In operation S120, an erase detect voltage RD_E may be applied to a selected word line, and in operation S140, the memory device 100 may count the number of undererased cells. When the erase detect voltage RD_E is applied to the memory cells having the normal erase state 81, the number of the undererased cells may be 0. When the erase detect voltage RD_E is applied to the memory cells having the abnormal erase state 82, the number of the undererased cells may correspond to a hatched region in the abnormal erase state 82.

Referring again to FIG. 7, in operation S150, the memory device 100 may determine whether the number of the undererased cells is greater than a reference bit count. In detail, the reference bit count may correspond to a value where a read error (i.e., an UECC) does not occur in a read result of each of programmed memory cells after the program operation is continuously performed on memory cells connected to a selected word line. In an embodiment, the reference bit count may correspond to the number of bits correctable by the ECC engine 210. In an embodiment, the reference bit count may be changed. For example, when a voltage level of the erase detect voltage is lowered, the reference bit count may increase, and when the voltage level of the erase detect voltage increases, the reference bit count may decrease. When the number of the undererased cells is determined to be greater than the reference bit count, operation S160 may be performed, and otherwise, operation S170 may be performed.

In operation S160, the program operation on the memory cells connected to the selected word line may end. In detail, the memory device 100 may process a memory block connected to the selected word line as a fail block and may transmit a fail message to the memory controller 200. In operation S170, the program operation on the memory cells connected to the selected word line may be continuously performed. In detail, the memory device 100 may perform succeeding program loops.

Figure 9:
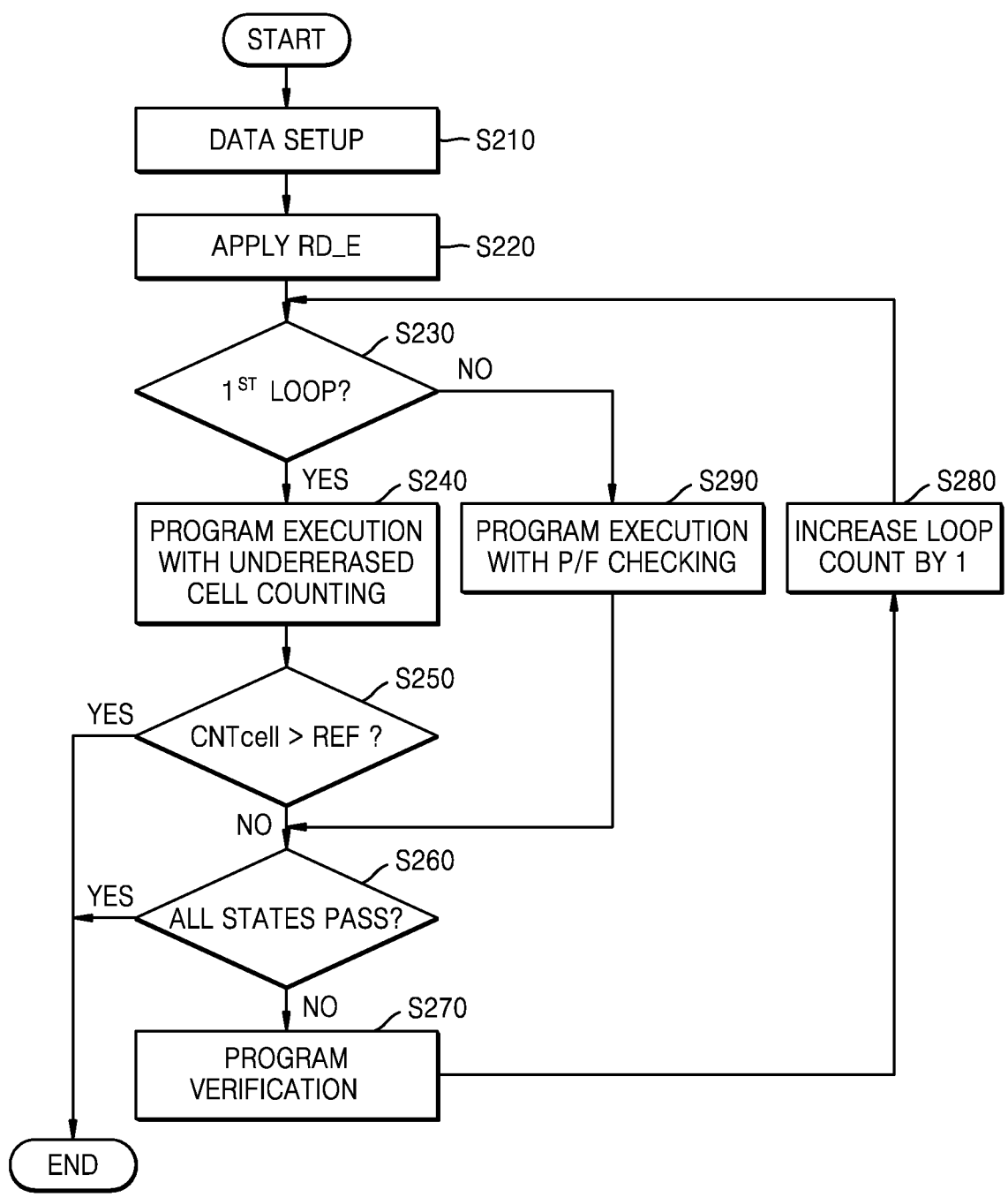
FIG. 9 is a flowchart illustrating a program method of a memory device according to an embodiment.
Figure 10A:
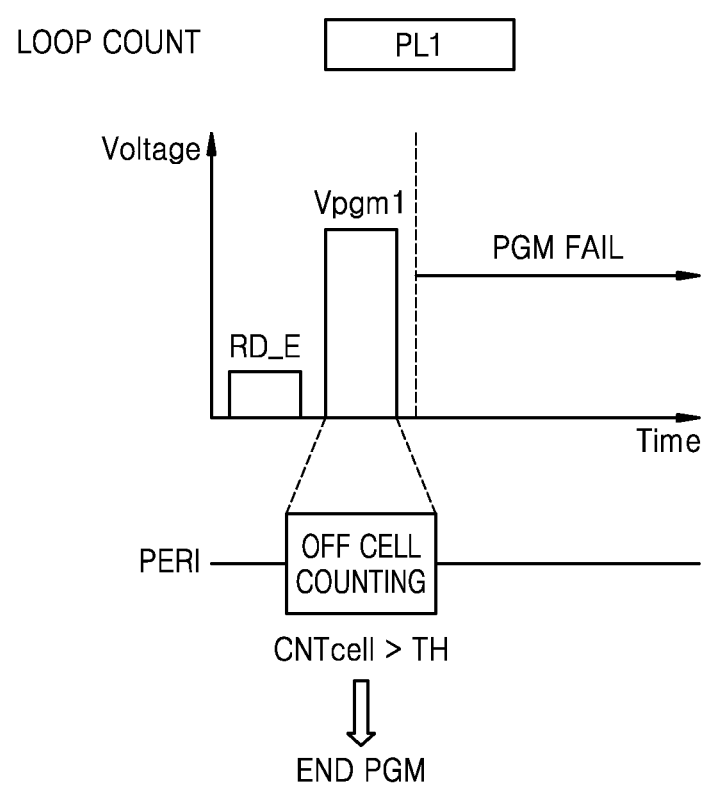
FIGS. 10A and 10B are timing diagrams showing the program method of FIG. 9.
Figure 10B:
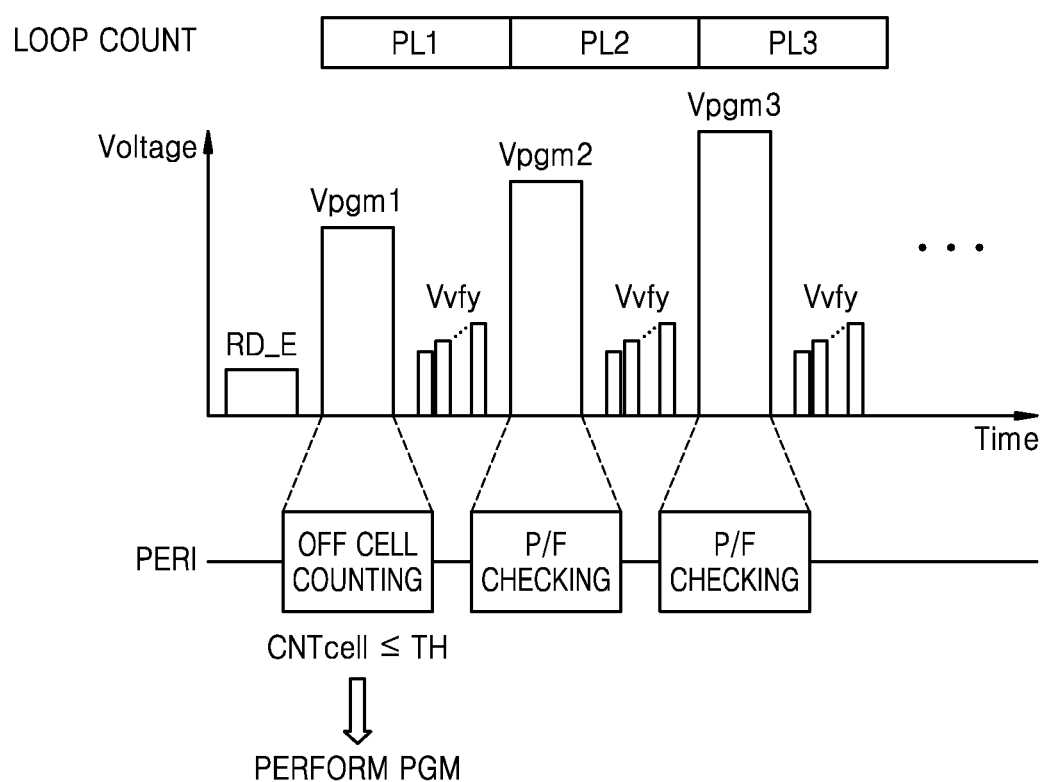

FIG. 9 is a flowchart illustrating a program method of a memory device according to an embodiment. FIGS. 10A and 10B are timing diagrams showing the program method of FIG. 9. Hereinafter, the program method according to an embodiment will be described with reference to FIGS. 1 and 9 to 10B. The program method may correspond to an implementation example of FIG. 7, and descriptions given above with reference to FIGS. 7 and 8 may be applied to the embodiment.

In operation S210, a data setup operation may be performed. For example, the memory device 100 may receive a program command CMD and program data DATA from the memory controller 200 and may load the received program data DATA into the page buffer unit 120. In operation S220, an erase detect voltage RD_E may be applied to a selected word line. In operation S230, the memory device 100 may determine whether a loop count is a first program loop PL1. When the loop count is determined to be the first program loop PL1, in operation S240, the memory device 100 may apply a first program pulse Vpgm1 to the selected word line to perform programming, and simultaneously, may count the number of undererased cells.

In operation S250, the memory device 100 may determine whether the counted number of the undererased cells CNTcell is greater than a reference bit count REF. When the counted number of the undererased cells CNTcell is determined to be greater than the reference bit count REF, as illustrated in FIG. 10A, the memory device 100 may end a program operation and may process a memory block as a fail block. When the counted number of the undererased cells CNTcell is determined to be less than or equal to the reference bit count REF, operation S260 may be performed, and as illustrated in FIG. 10B, the memory device 100 may continuously perform the program operation.

In operation S260, the memory device 100 may determine whether a program operation is passed on all program states. When the program operation is determined to be passed on all program states, the program operation may end, and otherwise, operation S270 may be performed. In operation S270, the memory device 100 may sequentially apply a plurality of program verify voltages Vvfy to the selected word line to perform a program verify operation on each of the program states. In operation S280, the loop count may increase by one. In operation S290, for example, in a second program loop PL2, the memory device 100 may apply a second program pulse Vpgm2 to the selected word line to perform programming, and simultaneously, may perform a P/F check operation.

Figure 11A:
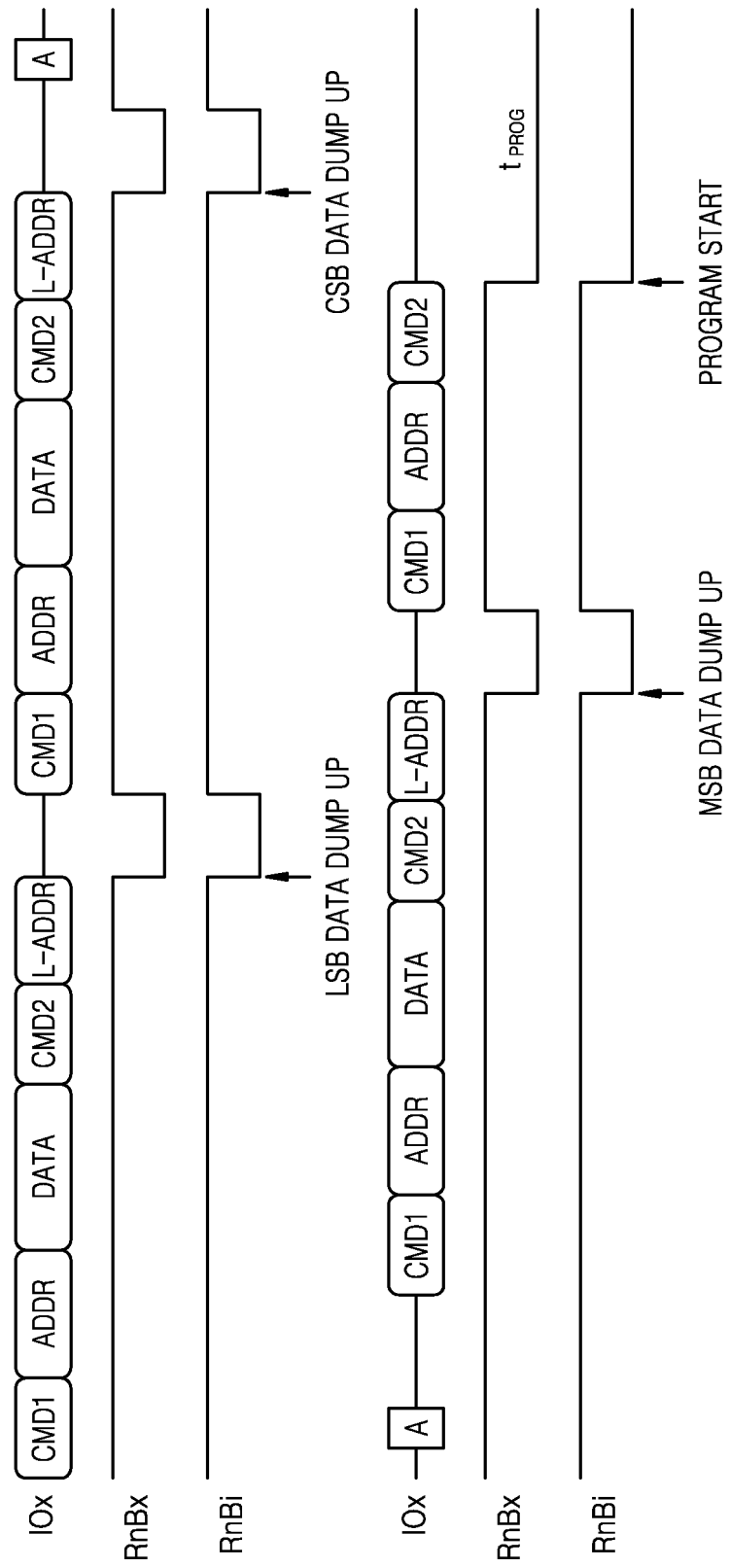
FIGS. 11A to 11C illustrate program sequences for performing a program method according to an embodiment.

FIG. 11A illustrates a normal program sequence according to an embodiment.

Referring to FIG. 11A, the memory device 100 may receive a first command CMD1, an address ADDR, data DATA including least significant bit (LSB) data, a second command CMD2, and a latch address L-ADDR indicating a first data latch from the memory controller 200 through an I/O line IOx. In this case, the first command CMD1 may be a kind of a memory operation, and the second command CMD2 may represent that a data output flow associated with the first command CMD1 is continued. The memory device 100 may transmit a ready/busy signal RnBx having a low level, e.g. a logic low level, to the memory controller 200, and while the ready/busy signal RnBx is maintaining a low level, the memory device 100 may dump the LSB data into the first data latch.

Subsequently, the memory device 100 may receive the first command CMD1, the address ADDR, data DATA including center significant bit (CSB) data, the second command CMD2, and a latch address L-ADDR indicating a second data latch from the memory controller 200 through the I/O line IOx. The memory device 100 may transmit the ready/busy signal RnBx having a low level to the memory controller 200, and while the ready/busy signal RnBx is maintaining a low level, the memory device 100 may dump the CSB data to the second data latch.

Subsequently, the memory device 100 may receive the first command CMD1, the address ADDR, data DATA including most significant bit (MSB) data, the second command CMD2, and a latch address L-ADDR indicating a third data latch from the memory controller 200 through the I/O line IOx. The memory device 100 may transmit the ready/busy signal RnBx having a low level to the memory controller 200, and while the ready/busy signal RnBx is maintaining a low level, the memory device 100 may dump the MSB data to the third data latch.

Subsequently, the memory device 100 may receive the first command CMD1, the address ADDR, and a confirm command including the second command CMD2. In this case, the first command CMD1 may be a kind of a memory operation, and the second command CMD2 may indicate a program operation. The memory device 100 may transmit the ready/busy signal RnBx having a low level to the memory controller 200, and while the ready/busy signal RnBx is maintaining a low level, the memory device 100 may perform a program operation.

Figure 11B:
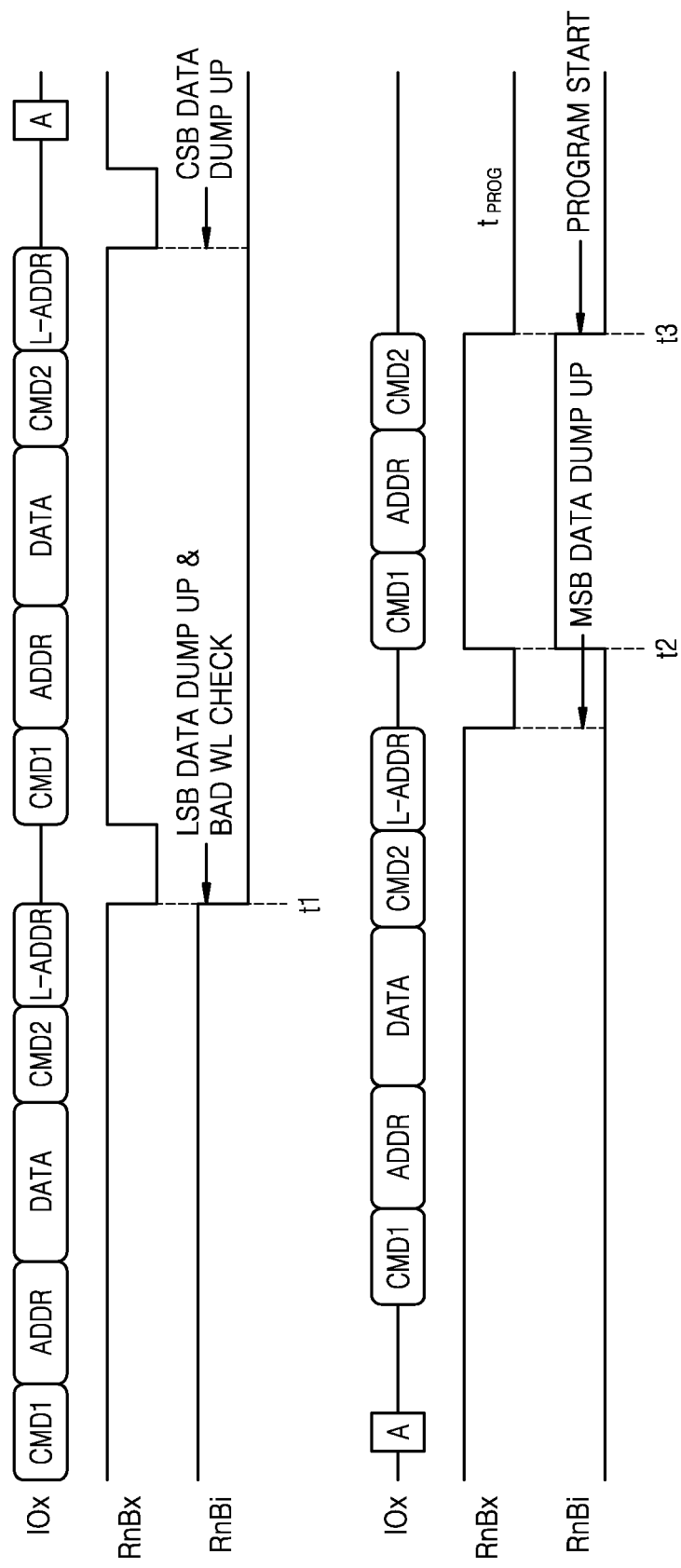

FIG. 11B illustrates an example where a defective word line is not detected in an erase detect operation performed in a data input interval, according to an embodiment. Referring to FIG. 11B, a program sequence according to the embodiment corresponds to a modification example of FIG. 11A, and in detail, has a difference with FIG. 11A in that the erase detect operation starts in an interval where LSB data is dumped. In the embodiment, the memory device 100 may maintain the ready/busy signal RnBi at a low level from a first time t1 to a second time t2, dump the LSB data at the first time t1, and start the erase detect operation on memory cells connected to a selected word line so as to check the defective word line. When the selected word line based on an address ADDR is not the defective word line as a result of the erase detect operation, the memory device 100 may start a program operation at a third time t3.

Figure 11C:
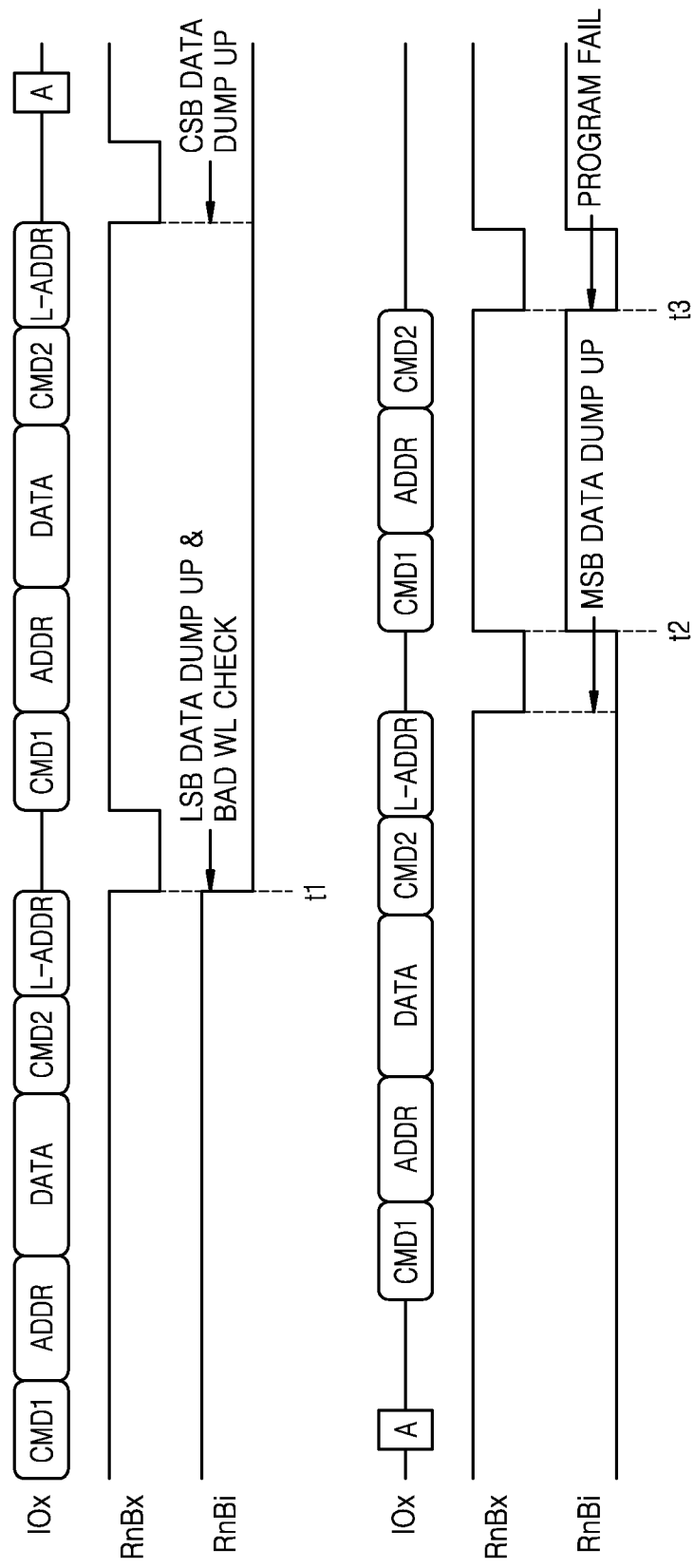

FIG. 11C illustrates an example where a defective word line is detected in an erase detect operation performed in a data input interval, according to an embodiment. Referring to FIG. 11C, a program sequence according to the embodiment may correspond to a modification example of FIG. 11B, and in detail, an operation after a confirm command is received may differ from FIG. 11B. In the embodiment, when a selected word line based on an address ADDR is the defective word line as a result of the erase detect operation, the memory device 100 may transmit a low-level ready/busy signal RnBi representing a program fail to the memory controller 200 at a third time t3 and may end a program operation.

Figure 12:
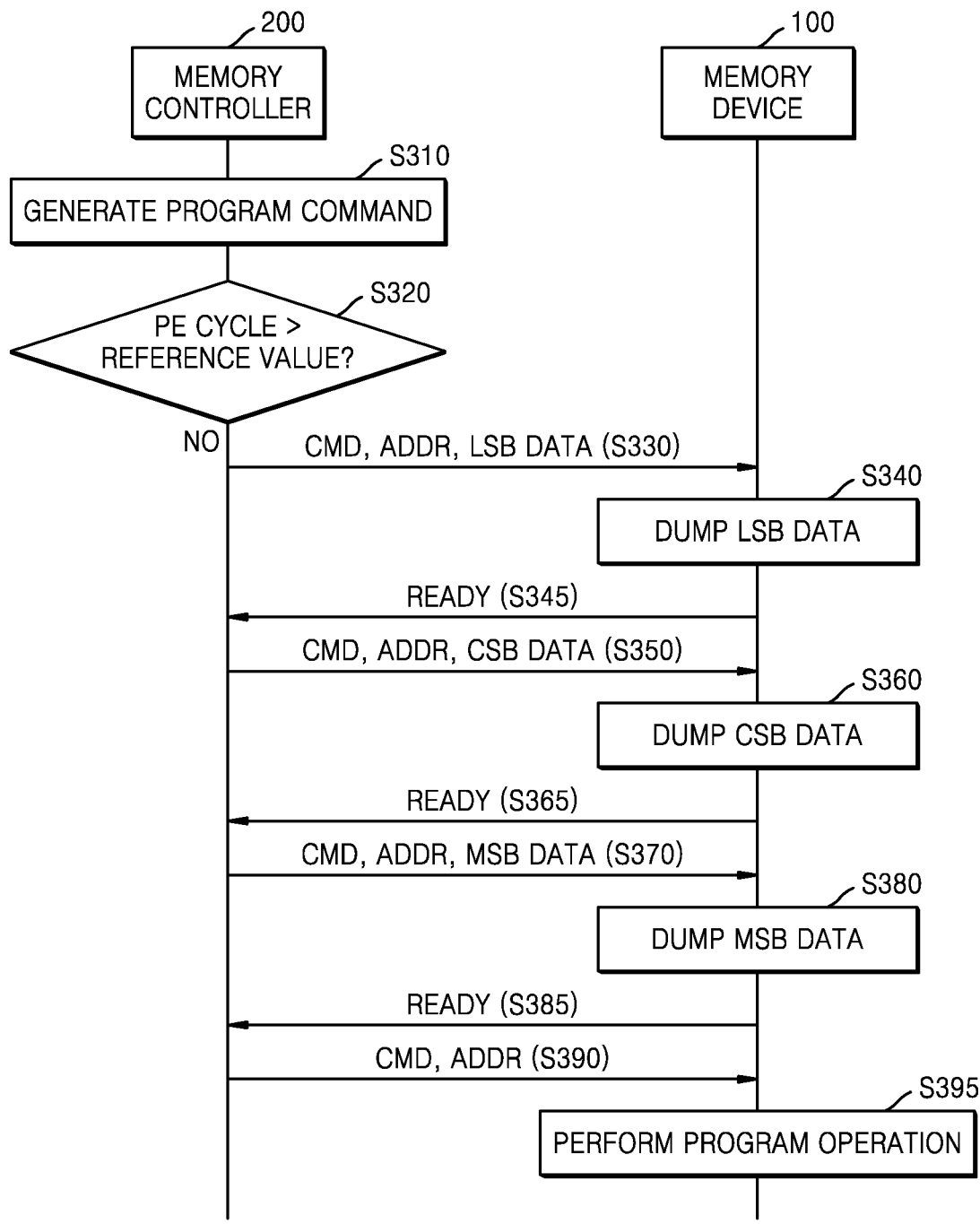
FIGS. 12 and 13 are flowcharts illustrating an operation between a memory controller and a memory device, according to some example embodiments.

FIG. 12 is a flowchart illustrating an operation between a memory controller and a memory device, according to an embodiment. In detail, the operation according to the embodiment may correspond to a case where a program/erase cycle is less than or equal to a reference value. In operation S310, the memory controller 200 may generate a program command. In operation S320, the memory controller 200 may determine whether the program/erase cycle is greater than the reference value. When the program/erase cycle is determined not to be greater than the reference value, operations S330 to S390 may be performed. For example, operations S330 to S390 may correspond to the embodiment of FIG. 11A.

In operation S330, the memory controller 200 may transmit a command CMD, an address ADDR, and LSB data to the memory device 100. For example, the command CMD may include the first command CMD1 and the second command CMD2 illustrated in FIG. 11A. In operation S340, the memory device 100 may dump the LSB data into a first data latch. In operation S345, the memory device 100 may transmit a ready signal to the memory controller 200. For example, the ready signal may correspond to a ready/busy signal RnBx having a high level, e.g. a logic high level.

In operation S350, the memory controller 200 may transmit the command CMD, the address ADDR, and CSB data to the memory device 100. In operation S360, the memory device 100 may dump the CSB data into a second data latch. In operation S365, the memory device 100 may transmit the ready signal to the memory controller 200. For example, when each of memory cells is an MLC, operations S350 to S365 may be omitted. For example, when each of memory cells is an SLC, operations S350 to S385 may be omitted. In operation S370, the memory controller 200 may transmit the command CMD, the address ADDR, and MSB data to the memory device 100. In operation S380, the memory device 100 may dump the MSB data into a third data latch. In operation S385, the memory device 100 may transmit the ready signal to the memory controller 200. In operation S390, the memory controller 200 may transmit a confirm command and the address ADDR to the memory device 100. In operation S395, the memory device 100 may perform a program operation.

Figure 13:
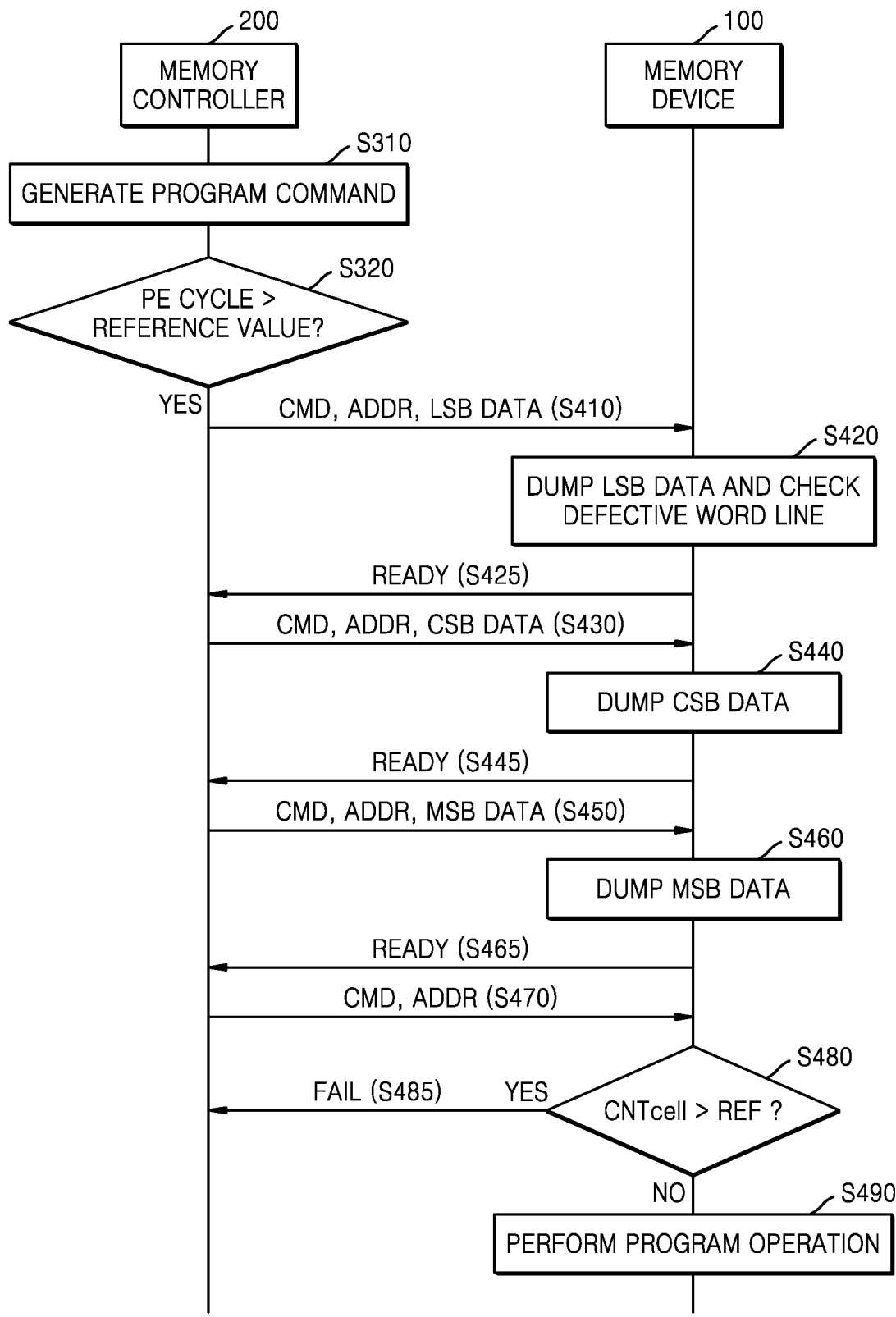

FIG. 13 is a flowchart illustrating an operation between a memory controller and a memory device, according to an embodiment. In detail, the operation according to the embodiment may correspond to a case where a program/erase cycle is greater than a reference value. Referring to FIG. 13, in operation S310, the memory controller 200 may generate a program command In operation S320, the memory controller 200 may determine whether the program/erase cycle is greater than the reference value. When the program/erase cycle is determined to be greater than the reference value, operations S410 to S490 may be performed. For example, operations S410 to S490 may correspond to the embodiments of FIGS. 11A and 11C.

In operation S410, the memory controller 200 may transmit a command CMD, an address ADDR, and LSB data to the memory device 100. For example, the command CMD may include the first command CMD1 and the second command CMD2 illustrated in FIG. 11B. In operation S420, the memory device 100 may dump the LSB data into a first data latch, perform an erase detect operation for checking a defective word line, and count the number of undererased cells. In this case, the erase detect operation and an operation of counting the number of the undererased cells may be performed in a specific (or, alternatively, an arbitrary) interval between operations S420 to S460. In operation S425, the memory device 100 may transmit a ready signal to the memory controller 200. For example, the ready signal may correspond to a ready/busy signal RnBx having a high level. Also, the memory device 100 may continuously maintain a ready/busy signal RnBi at a low level so as to perform the erase detect operation.

In operation S430, the memory controller 200 may transmit the command CMD, the address ADDR, and CSB data to the memory device 100. In operation S440, the memory device 100 may dump the CSB data into a second data latch. In operation S445, the memory device 100 may transmit the ready signal to the memory controller 200. For example, when each of memory cells is an MLC, operations S430 to S445 may be omitted. For example, when each of memory cells is an SLC, operations S430 to S470 may be omitted. In operation S450, the memory controller 200 may transmit the command CMD, the address ADDR, and MSB data to the memory device 100. In operation S460, the memory device 100 may dump the MSB data into a third data latch. In operation S465, the memory device 100 may transmit the ready signal to the memory controller 200. In operation S470, the memory controller 200 may transmit a confirm command and the address ADDR to the memory device 100.

In operation S480, the memory device 100 may determine whether the counted number of undererased cells is greater than a reference bit count. When the counted number of the undererased cells is determined to be greater than the reference bit count, operation S485 may be performed, and otherwise, operation S490 may be performed. In operation S485, the memory device 100 may transmit a fail message to the memory controller 200. In operation S490, the memory device 100 may perform a program operation.

Figure 14:
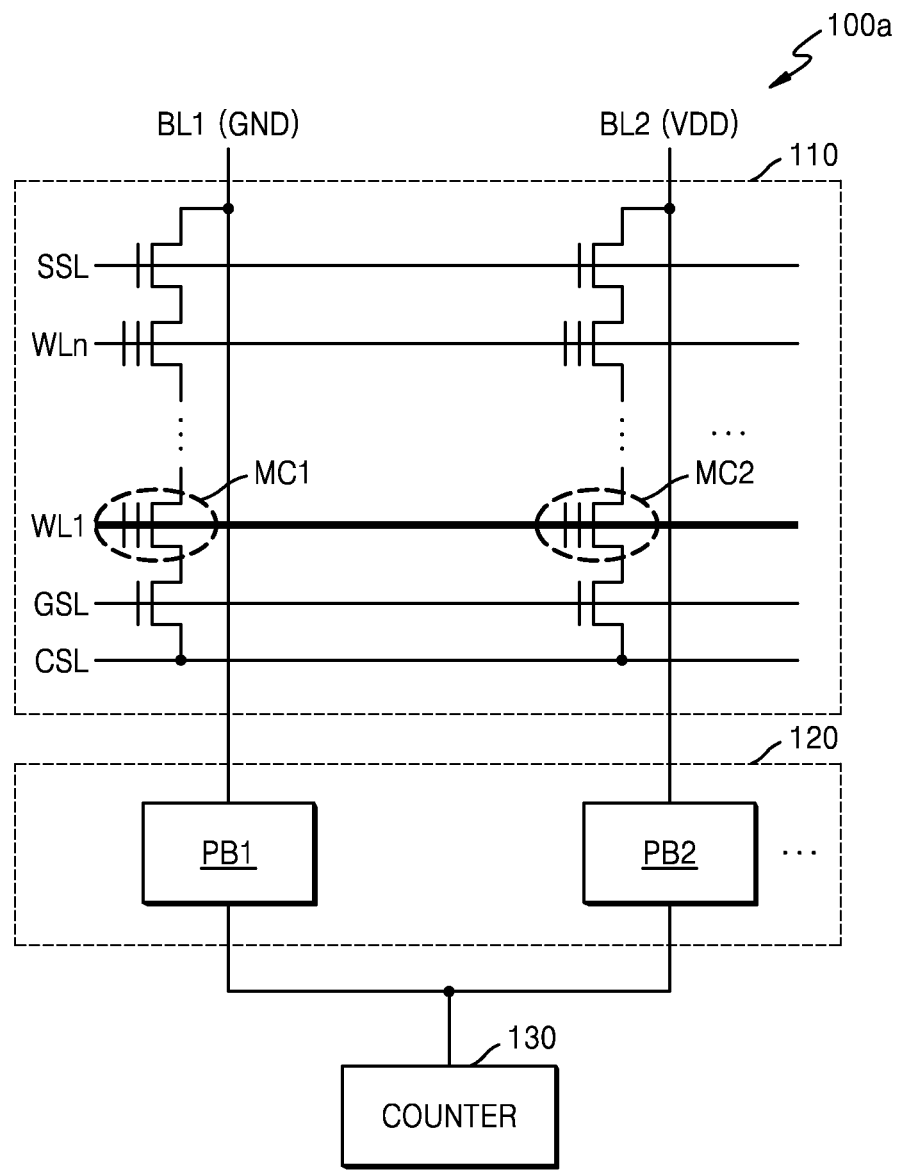
FIG. 14 illustrates a memory device according to an embodiment.

FIG. 14 illustrates a memory device 100a according to an embodiment.

Referring to FIG. 14, the memory device 100a may correspond to an example of the memory device 100 of FIG. 3. For example, a selected word line for performing a program operation may be WL1. In a program perform interval, a program voltage may be applied to the selected word line WL1, a ground voltage GND may be applied to a first bit line BL1, and a power supply voltage VDD may be applied to a second bit line BL2. Therefore, a first memory cell MC1 connected to the first bit line BL1 may be programmed, and a second memory cell MC2 connected to the second bit line BL2 may be program-inhibited. In this case, the first memory cell MC1 may be referred to as a programmed memory cell, and the second memory cell MC2 may be referred to as a program-inhibited memory cell. In a program verify interval, an erase detect voltage RD_E may be applied to the selected word line WL1, and then, a first program verify voltage Vvfy1 may be applied to the selected word line WL1. Hereinafter, an operating method of the memory device 100a will be described with reference to FIGS. 15 and 16.

Figure 15:
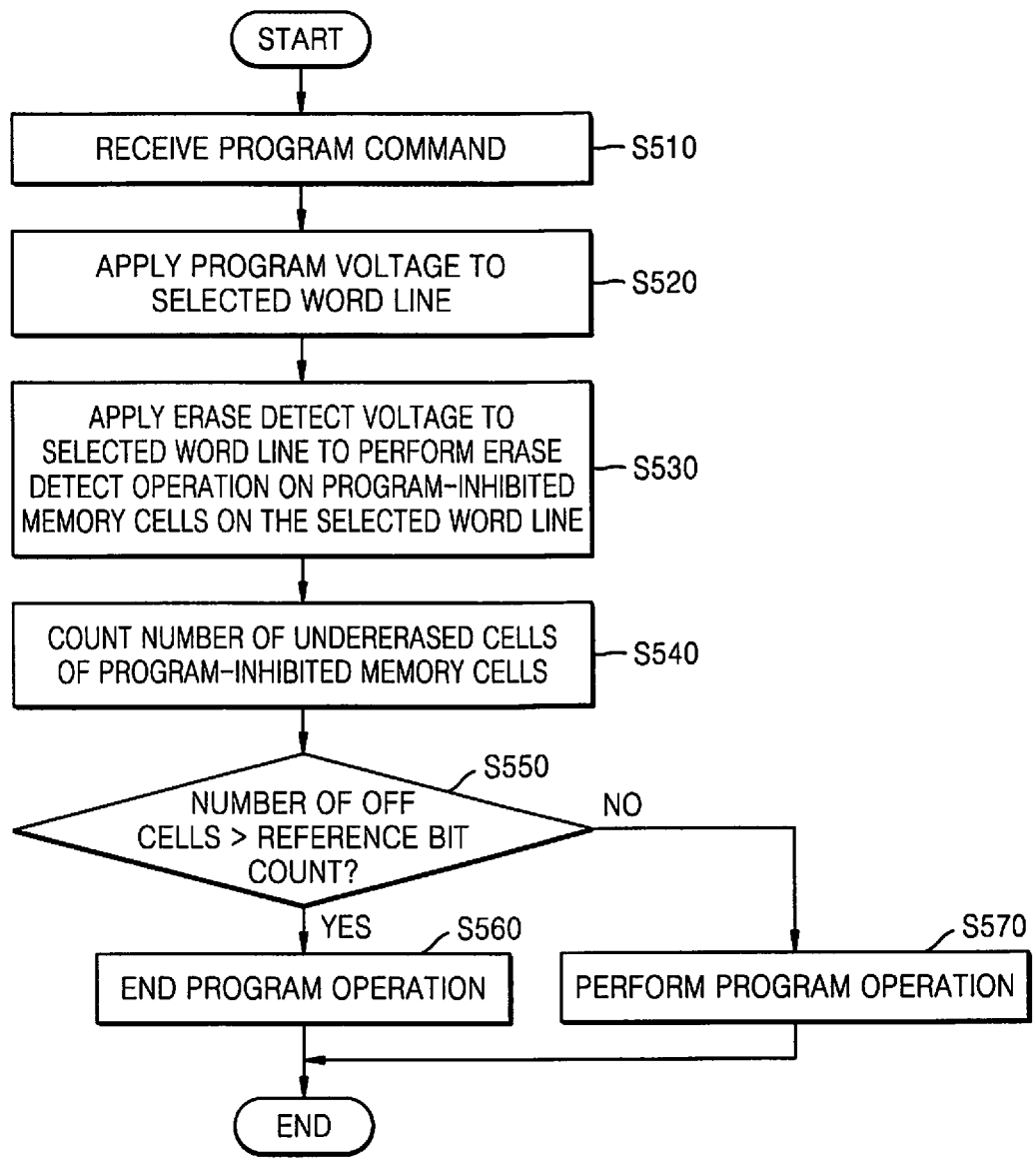
FIG. 15 is a flowchart illustrating an operating method of a memory device according to an embodiment.

FIG. 15 is a flowchart illustrating an operating method of a memory device according to an embodiment. Referring to FIG. 15, the operating method according to an embodiment may correspond to a method which checks a defective word line by performing an erase detect operation in a program operation of the memory device, and for example, may include processes which are time-serially performed by the memory device 100a of FIG. 14.

In operation S510, the memory device 100a may receive a program command. In operation S520, the memory device may apply the program voltage to a selected word line. Also, the ground voltage GND may be applied to the first bit line BL1, and the power supply voltage VDD may be applied to the second bit line BL2. Therefore, a selected memory cell MC1 may be programmed, and an unselected memory cell MC2 may be program-inhibited.

In operation S530, by applying the erase detect voltage RD_E to the selected word line WL1, the memory device 100a may perform the erase detect operation on memory cells connected to the selected word line. For example, the memory device 100a may apply the erase detect voltage RD_E to the selected word line WL1. In an embodiment, a voltage level of the erase detect voltage RD_E may be lower than a verify voltage (for example, Vvfy1) having a lowest program state for the memory cells.

In operation S540, the memory device 100a may count the number of undererased cells of program-inhibited memory cells. For example, the program-inhibited memory cells may correspond to memory cells where a target state is an erase state. For example, the counter 130 may receive a page buffer signal from the page buffer unit 120 and may count the number of undererased cells, based on the received page buffer signal. In an embodiment, the operating method may further include a process, performed between operation S540 and operation S550, of applying the program verify voltage to the selected word line WL1 to perform the program verify operation on the memory cells connected to the selected word line WL1.

In operation S550, the memory device 100a may determine whether the number of the undererased cells is greater than a reference bit count. In detail, the reference bit count may correspond to a value where a read error (i.e., an UECC) does not occur in a read result of each of programmed memory cells after the program operation is continuously performed on the memory cells connected to the selected word line WL1. When the number of the undererased cells is determined to be greater than the reference bit count, operation S560 may be performed, and otherwise, operation S570 may be performed. In operation S560, the memory device 100a may end the program operation on the memory cells connected to the selected word line WL1. In detail, the memory device 100a may process a memory block connected to the selected word line WL1 as a fail block. In operation S570, the program operation on the memory cells connected to the selected word line WL1 may be continuously performed. In detail, the memory device 100a may perform succeeding program loops.

Figure 16:
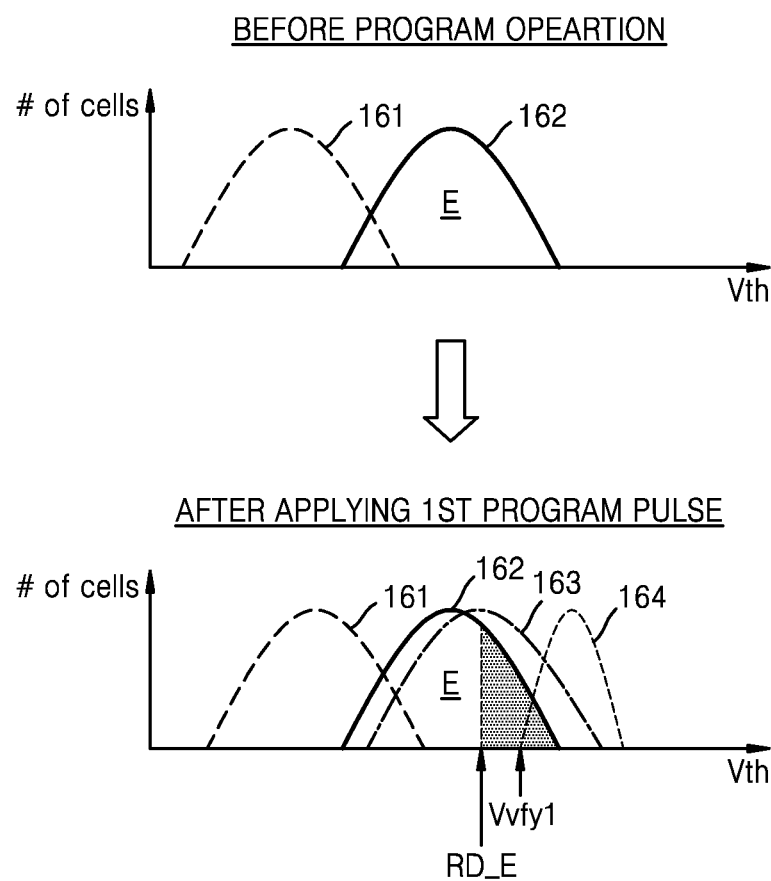
FIG. 16 illustrates a threshold voltage distribution of memory cells based on the operating method of FIG. 15.

FIG. 16 illustrates a threshold voltage distribution of memory cells based on the operating method of FIG. 15.

Referring to FIG. 16, before a program operation, memory cells connected to a normal word line may have a normal erase state 161, and memory cells connected to a defective word line may have an abnormal erase state 162. When a first program pulse Vpgm1 is applied to a selected word line, programmed memory cells of the memory cells having the normal erase state 161 may have a first program state 164, and program-inhibited memory cells may maintain the normal erase state 161. When the first program pulse Vpgm1 is applied to the selected word line, programmed memory cells of the memory cells having the abnormal erase state 162 may have a second program state 163, and the program-inhibited memory cells may maintain the abnormal erase state 162. When an erase detect voltage RD_E is applied to the memory cells having the abnormal erase state 162, the number of undererased cells may correspond to a hatched region in the abnormal erase state 162.

Figure 17:
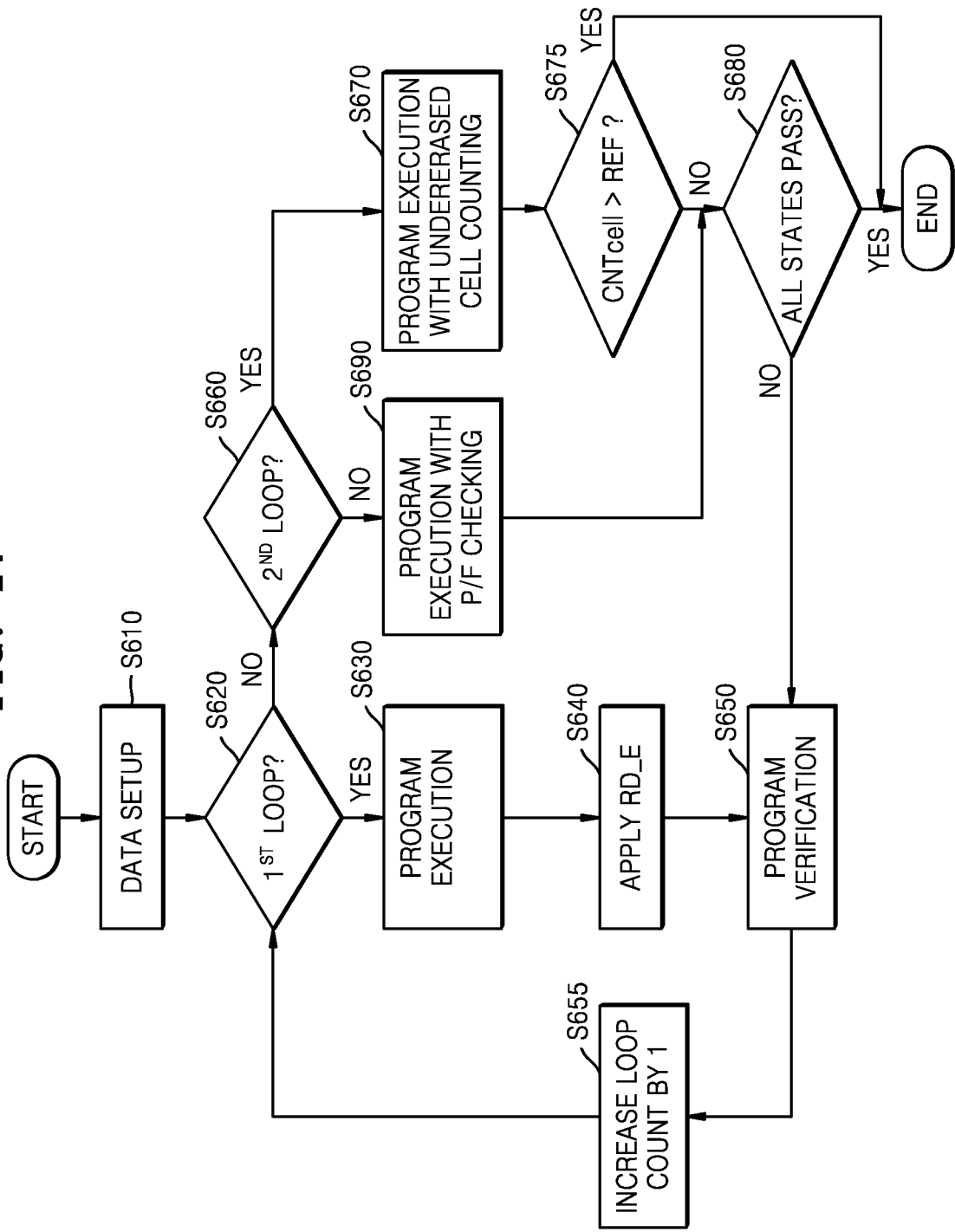
FIG. 17 is a flowchart illustrating a program method of a memory device according to an embodiment.
Figure 18A:
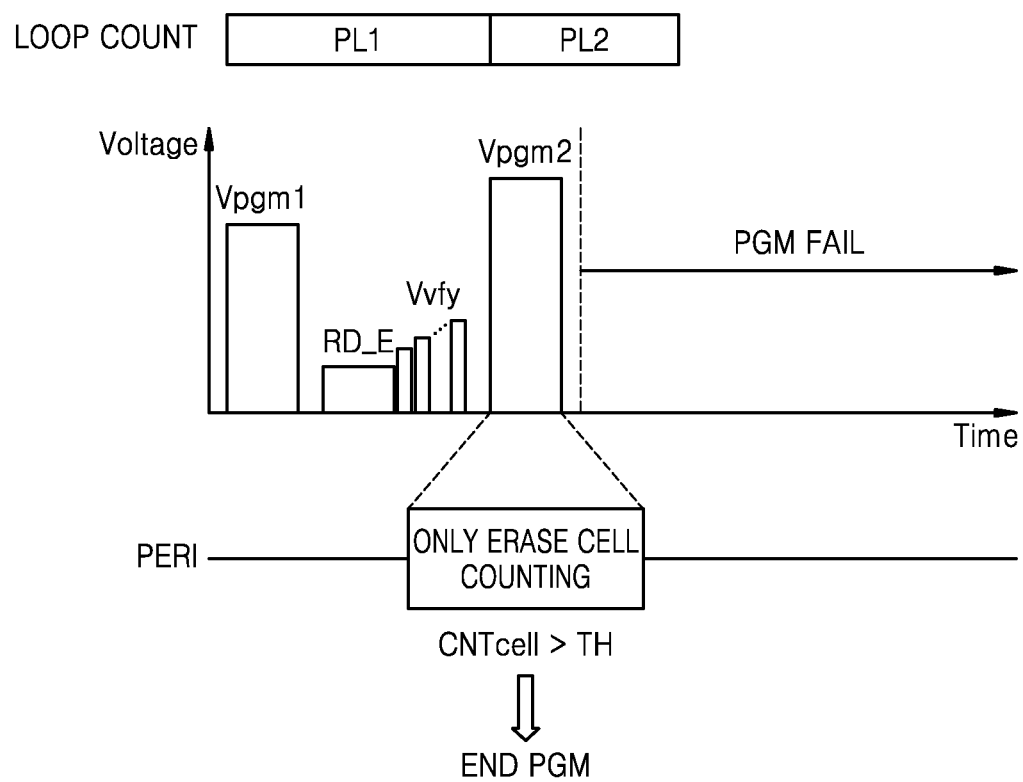
FIGS. 18A and 18B are timing diagrams showing the program method of FIG. 17.
Figure 18B:
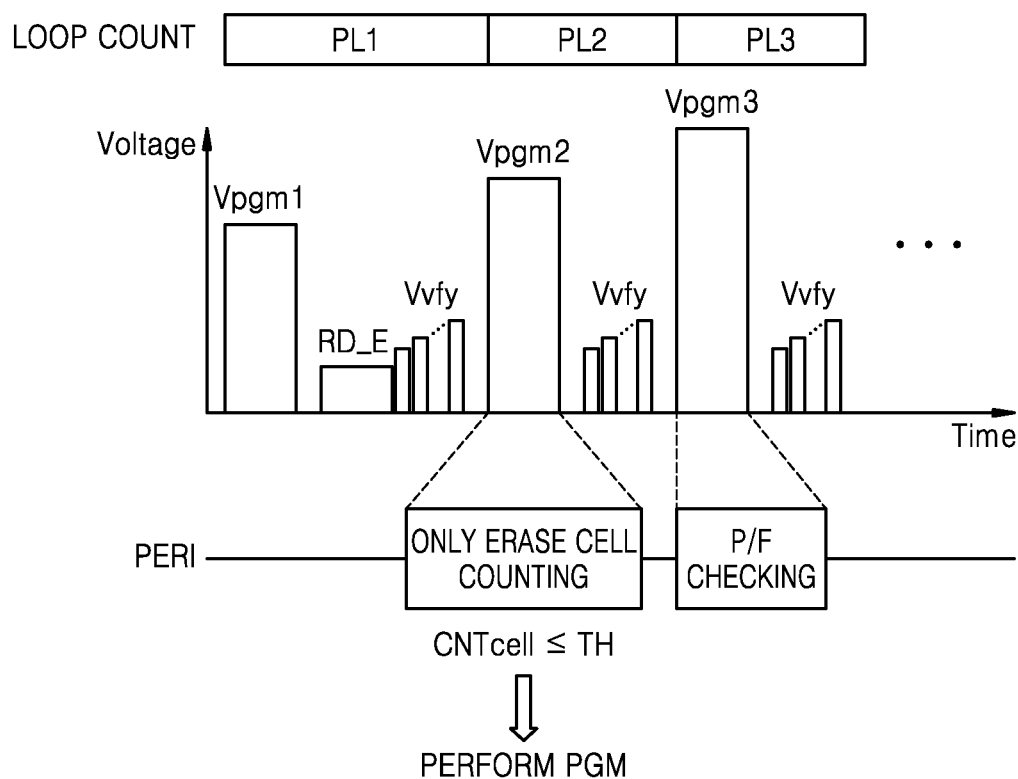

FIG. 17 is a flowchart illustrating a program method of a memory device according to an embodiment. FIGS. 18A and 18B are timing diagrams showing the program method of FIG. 17. Hereinafter, the program method according to an embodiment will be described with reference to FIGS. 14 and 17 to 18B. The program method may correspond to an implementation example of FIG. 15, and descriptions given above with reference to FIGS. 15 and 16 may be applied to the embodiment.

In operation S610, a data setup operation may be performed. In operation S620, the memory device may determine whether a loop count is a first program loop PL1. When the loop count is determined to be the first program loop PL1, in operation S630, the memory device may apply a first program pulse Vpgm1 to a selected word line to perform programming In operation S640, an erase detect voltage RD_E may be applied to the selected word line. In operation S650, the memory device may sequentially apply a plurality of program verify voltages Vvfy to the selected word line to perform a program verify operation on each of the program states. In an embodiment, operation S650 may be performed after operation S640. In an embodiment, operation S640 may be performed after operation S650. In operation S655, the loop count may increase by one.

In operation S660, the memory device may determine whether the loop count is a second program loop PL2. When the loop count is determined to be the second program loop PL2, in operation S670, the memory device may apply a second program pulse Vpgm2 to the selected word line to perform programming, and simultaneously, may count the number of undererased cells. In operation S675, the memory device may determine whether the counted number of the undererased cells CNTcell is greater than a reference bit count REF. When the counted number of the undererased cells CNTcell is determined to be greater than the reference bit count REF, as illustrated in FIG. 18A, the memory device may end a program operation and may process a memory block as a fail block. When the counted number of the undererased cells CNTcell is determined to be less than or equal to the reference bit count REF, operation S680 may be performed, and as illustrated in FIG. 18B, the memory device may continuously perform the program operation.

In operation S680, the memory device may determine whether a program is passed on all program states. When the program is determined to be passed on all program states, the program operation may end, and otherwise, operation S650 may be performed. In operation S650, the memory device may sequentially apply a plurality of program verify voltages Vvfy to the selected word line to perform a program verify operation on each of the program states. In operation S655, the loop count may increase by one. In operation S660, the memory device may determine whether the loop count is the second program loop PL2. In operation S690, for example, in a third program loop PL3, the memory device may apply a third program pulse Vpgm3 to the selected word line to perform programming, and simultaneously, may check a pass/fail of the program operation.

Figure 19:
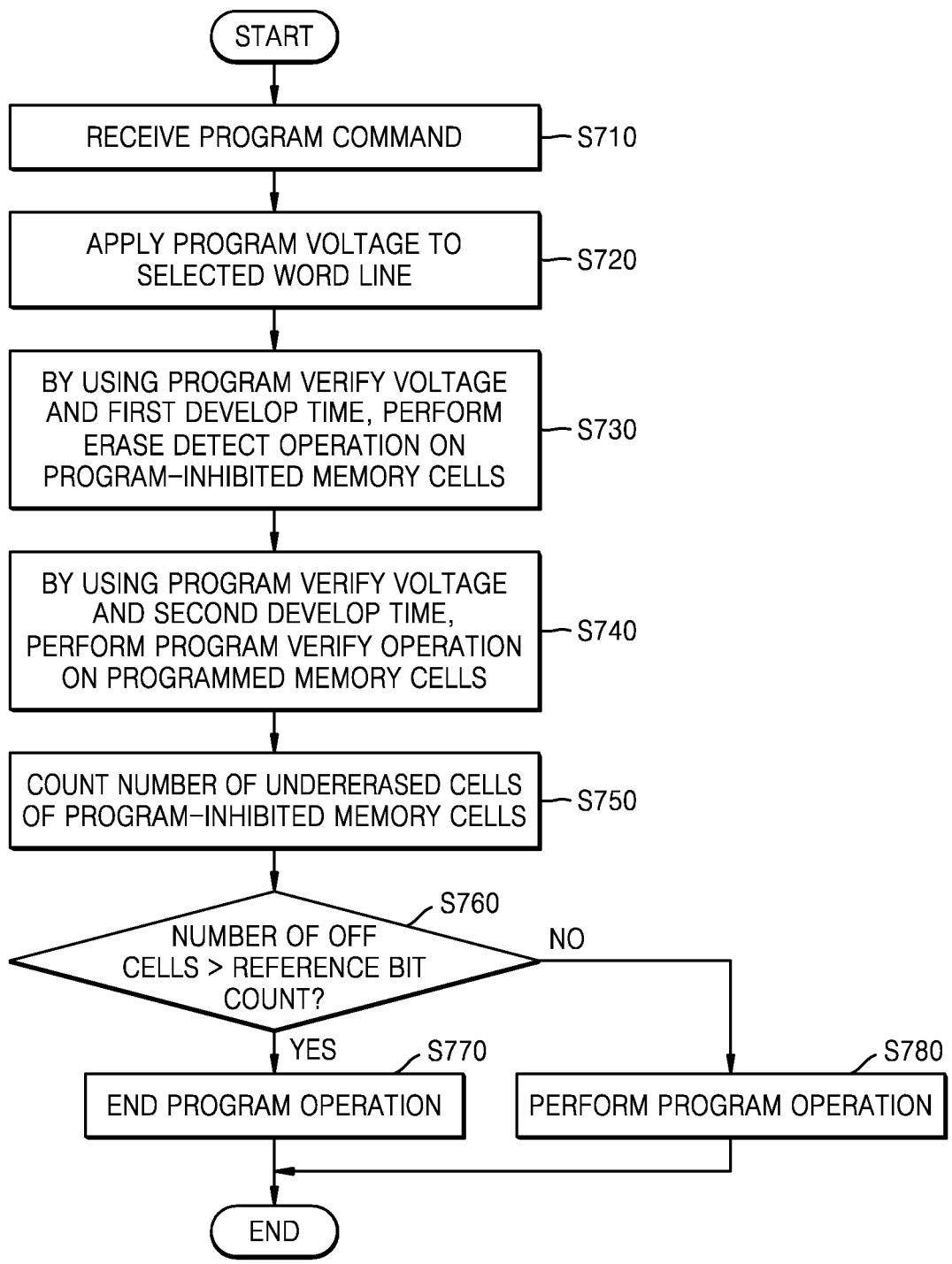
FIG. 19 is a flowchart illustrating an operating method of a memory device according to an embodiment.

FIG. 19 is a flowchart illustrating an operating method of a memory device according to an embodiment. Referring to FIG. 19, the operating method according to an embodiment may correspond to a method which checks a defective word line by performing an erase detect operation in a program operation of the memory device, and for example, may include processes which are time-serially performed by the memory device 100a of FIG. 14.

In operation S710, the memory device may receive a program command In operation S720, the memory device may apply a program voltage to a selected word line. For example, the memory device 100a may apply a first program pulse Vpgm1 to a selected word line WL1. Also, a ground voltage GND may be applied to a first bit line BL1, and a power supply voltage VDD may be applied to a second bit line BL2. Therefore, a selected memory cell MC1 may be programmed, and an unselected memory cell MC2 may be program-inhibited. In operation S730, an erase detect operation may be performed on the program-inhibited memory cells by using a program verify voltage and a first develop time. In operation S740, a program verify operation may be performed on the programmed memory cells by using the program verify voltage and a second develop time. In an embodiment, the first develop time may be shorter than the second develop time.

In operation S750, the memory device may count the number of undererased cells of the program-inhibited memory cells. For example, the program-inhibited memory cells may correspond to memory cells where a target state is an erase state. In operation S760, the memory device may determine whether the number of the undererased cells is greater than a reference bit count. When the number of the undererased cells is determined to be greater than the reference bit count, operation S770 may be performed, and otherwise, operation S780 may be performed. In operation S770, the memory device may end a program operation on the memory cells connected to the selected word line. In detail, the memory device may process a memory block connected to the selected word line as a fail block. In operation S780, the program operation on the memory cells connected to the selected word line may be continuously performed. In detail, the memory device may perform succeeding program loops.

Figure 20A:
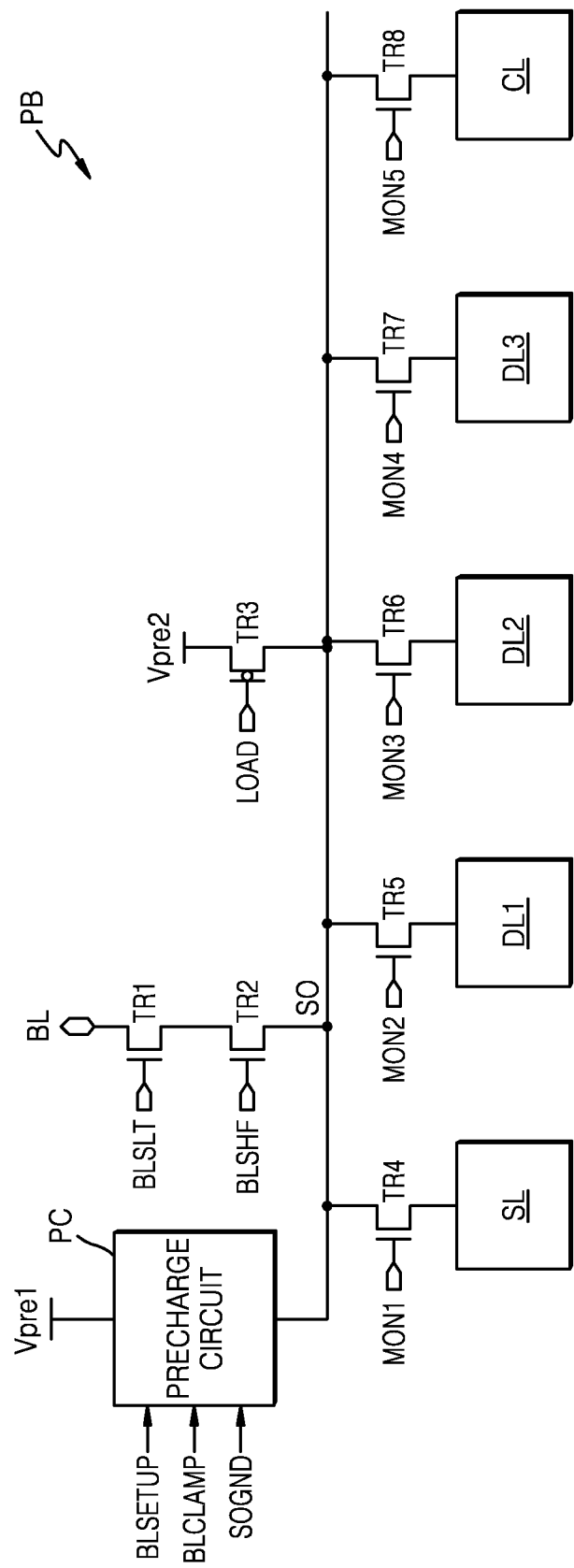
FIG. 20A is a circuit diagram illustrating a page buffer according to an embodiment.

FIG. 20A is a circuit diagram illustrating a page buffer PB according to an embodiment.

Referring to FIG. 20A, the page buffer PB may correspond to one of the first and second page buffers PB1 and PB2 of FIG. 14. The page buffer PB may include a precharge circuit PC, a sensing latch SL, first to third data latches DL1 to DL3, and a cache latch CL which are connected to a sensing node SO. The number of the first to third data latches DL1 to DL3 may vary based on a data bit stored in a memory cell. Also, the page buffer PB may further include a bit line selection transistor TR1, a bit line voltage control transistor TR2, a precharge transistor TR3, and a plurality of monitoring transistors TR4 to TR8.

In an embodiment, the page buffer PB may perform a program verify operation on memory cells which have been programmed in a program operation, and may perform an erase detect operation on program-inhibited memory cells.

In detail, the page buffer PB may store data, sensed through a bit line BL in a program verify operation, in the sensing latch SL. In this case, a second develop time for the programmed memory cells may be longer than a first develop time for the program-inhibited memory cells.

The first data latch DL1 storing target data may be set based on the sensed data stored in the sensing latch SL. For example, when the sensed data represents completion of programming, the first data latch DL1 may be changed to a program inhibit setting for a memory cell selected from a below-described program loop. The cache latch CL may temporarily store input data provided from the outside. In the program operation, the target data stored in the cache latch CL may be stored in the first to third data latches DL1 to DL3.

Figure 20B:
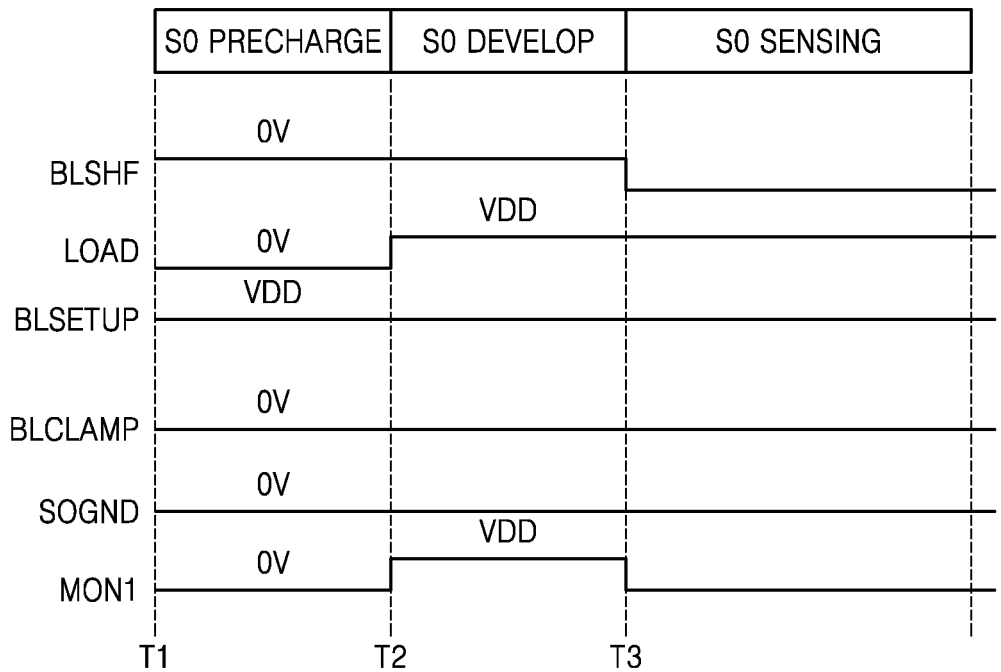
FIG. 20B is a timing diagram showing control signals applied to the page buffer of FIG. 20A.

FIG. 20B is a timing diagram showing control signals applied to the page buffer PB of FIG. 20A.

Referring to FIGS. 20A and 20B, at a time T1, a precharge control signal LOAD may be provided at a low level (for example, 0V) so as to precharge the sensing node SO. Therefore, the precharge transistor TR3 may be turned on, and a voltage level of the sensing node SO may increase to a precharge level (for example, Vpre2). Also, a bit line voltage control signal BLSHF may be shifted to a power supply voltage level (for example, VDD) so as to precharge a bit line BL connected to the sensing node SO. Accordingly, the bit line voltage control transistor TR2 may be turned on, and a voltage level of the bit line BL may increase to a certain bit line voltage. A precharge operation on the bit line BL may be performed until the precharge transistor TR3 is turned off. At this time, a bit line clamping control signal BLCLAMP, a ground control signal SOGND, and a monitor control signal MON1 may be provided at a low level (for example, 0V), and a bit line setup control signal BLSETUP may be provided at a power supply voltage level (for example, VDD).

At a time T2, a develop operation on the sensing node SO may be performed. In order to develop the sensing node SO, the precharge control signal LOAD and the monitor control signal MON1 may be shifted to the power supply voltage level (for example, VDD). Therefore, a voltage of the sensing node SO may be lowered based on a threshold voltage of a selected memory cell, and the voltage of the sensing node SO may be stored in the sensing latch SL. At a time T3, data may be latched in a data latch DL, based on data stored in the sensing latch SL.

Figure 21:
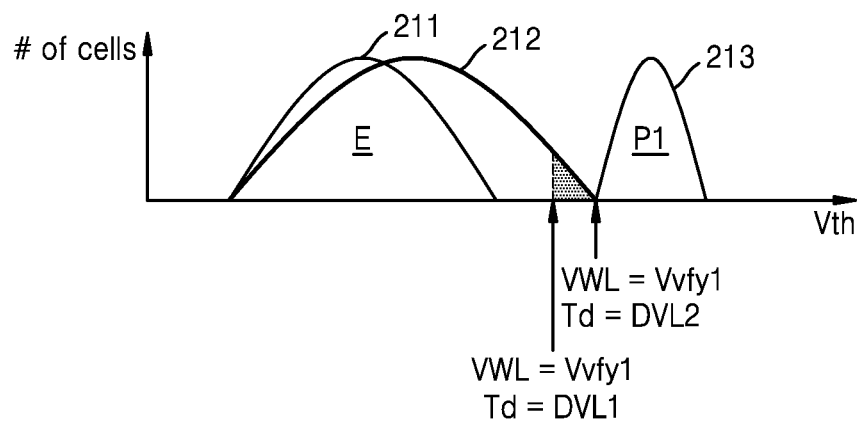
FIG. 21 illustrates a threshold voltage distribution of memory cells based on the operating method of FIG. 19.

FIG. 21 illustrates a threshold voltage distribution of memory cells based on the operating method of FIG. 19. Referring to FIG. 21, before a program operation, memory cells connected to a normal word line may have a normal erase state 211, and memory cells connected to a defective word line may have an abnormal erase state 212. When a first program pulse Vpgm1 is applied to a selected word line, programmed memory cells of the memory cells connected to the selected word line may have a first program state 213, and program-inhibited memory cells may maintain the normal erase state 211 or the abnormal erase state 212.

In an embodiment, an erase detect operation may be performed on the program-inhibited memory cells by using a first program verify voltage Vvfy1 and a first develop time DVL1. Subsequently, the number of undererased cells of the program-inhibited memory cells may be counted, and the undererased cells may correspond to the hatched region in the abnormal erase state 212. In an embodiment, a program verify operation may be performed on the programmed memory cells by using the first program verify voltage Vvfy1 and a second develop time DVL2.

Figure 22:
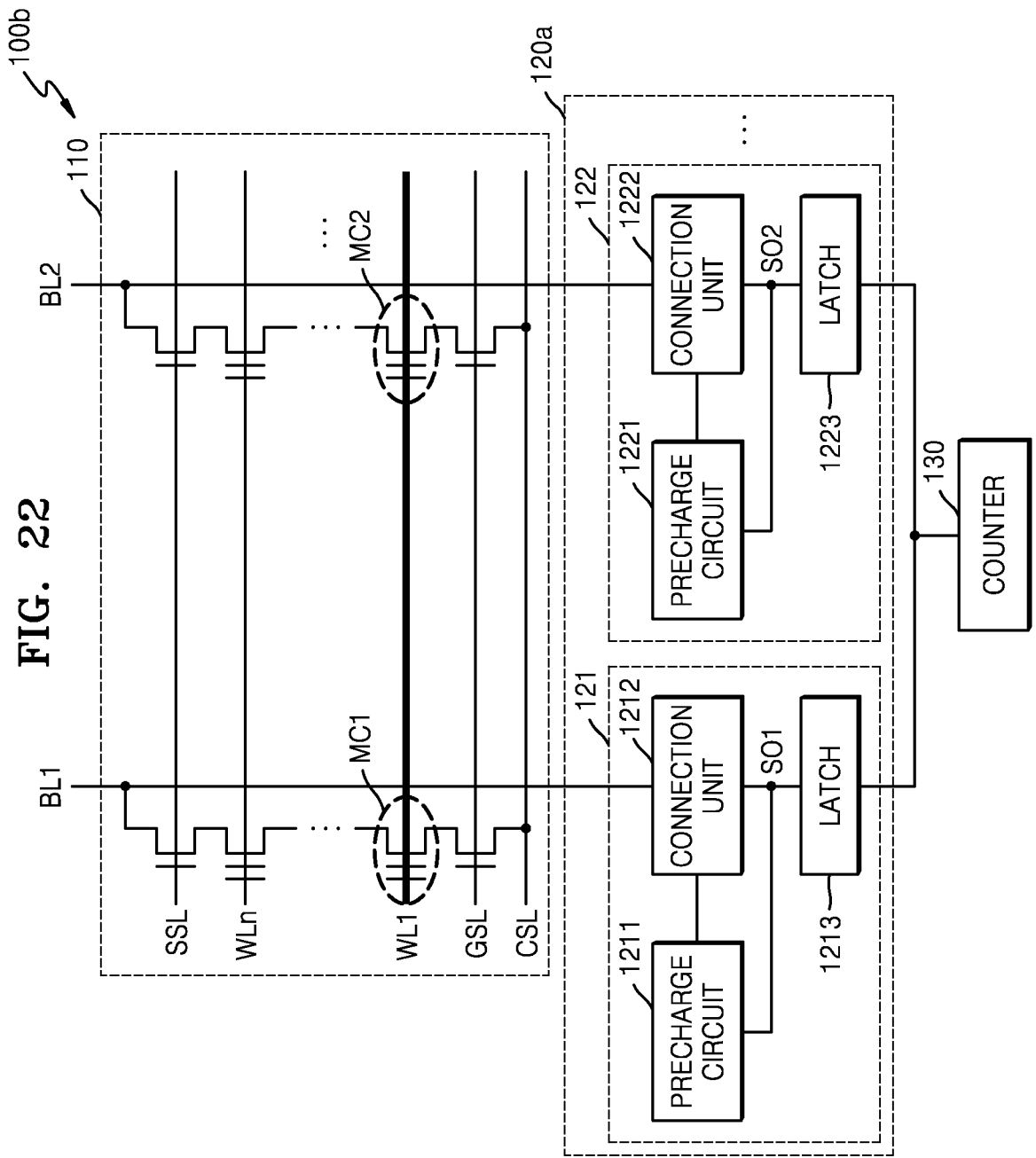
FIG. 22 illustrates a memory device according to an embodiment.

FIG. 22 illustrates a memory device 100b according to an embodiment.

Referring to FIG. 22, the memory device 100b may correspond to an example of the memory device 100 of FIG. 3. A page buffer unit 120a may include first and second page buffers 121 and 122. The first page buffer 121 may include a precharge circuit 1211, a connection unit 1212, and a latch 1213. The connection unit 1212 may connect a first bit line BL1 to a first sensing node SO1. The second page buffer 122 may include a precharge circuit 1221, a connection unit 1222, and a latch 1223. The connection unit 1222 may connect a second bit line BL2 to a second sensing node SO2. For example, each of the precharge circuits 1211 and 1221 may correspond to the precharge circuit PC and the third transistor TR3 of FIG. 20A, each of the connection units 1212 and 1222 may correspond to the first and second transistors TR1 and TR2 of FIG. 20A, and each of the latches 1213 and 1223 may correspond to the fourth to eighth second transistors TR4 to TR8, the sensing latch SL, the first to third data latches DL1 to DL3, and the cache latch CL of FIG. 20A. Elements of the page buffer unit 120a, for example, the precharge circuits 1211 and 1221, the connection units 1212 and 1222, the latches 1213 and 1223, and the counter 130 may be implemented in hardware.

In a program interval, a program voltage may be applied to a selected word line WL1, a ground voltage GND may be applied to a first bit line BL1, and a power supply voltage VDD may be applied to a second bit line BL2. Therefore, a first memory cell MC1 connected to the first bit line BL1 may be programmed, and a second memory cell MC2 connected to the second bit line BL2 may be program-inhibited. In a program verify interval, a first program verify voltage Vvfy1 may be applied to the selected word line WL1. In an embodiment, the first page buffer 121 connected to the first memory cell MC1 may perform a program verify operation on the first memory cell MC1 by developing the first sensing node SO1 during a second develop time DLV2. In an embodiment, the second page buffer 122 connected to the second memory cell MC2 may perform an erase detect operation on the second memory cell MC2 by developing the second sensing node SO2 during the second develop time DLV2. Hereinafter, an operating method of the memory device 100b will be described in detail with reference to FIGS. 23 to 25B.

Figure 23:
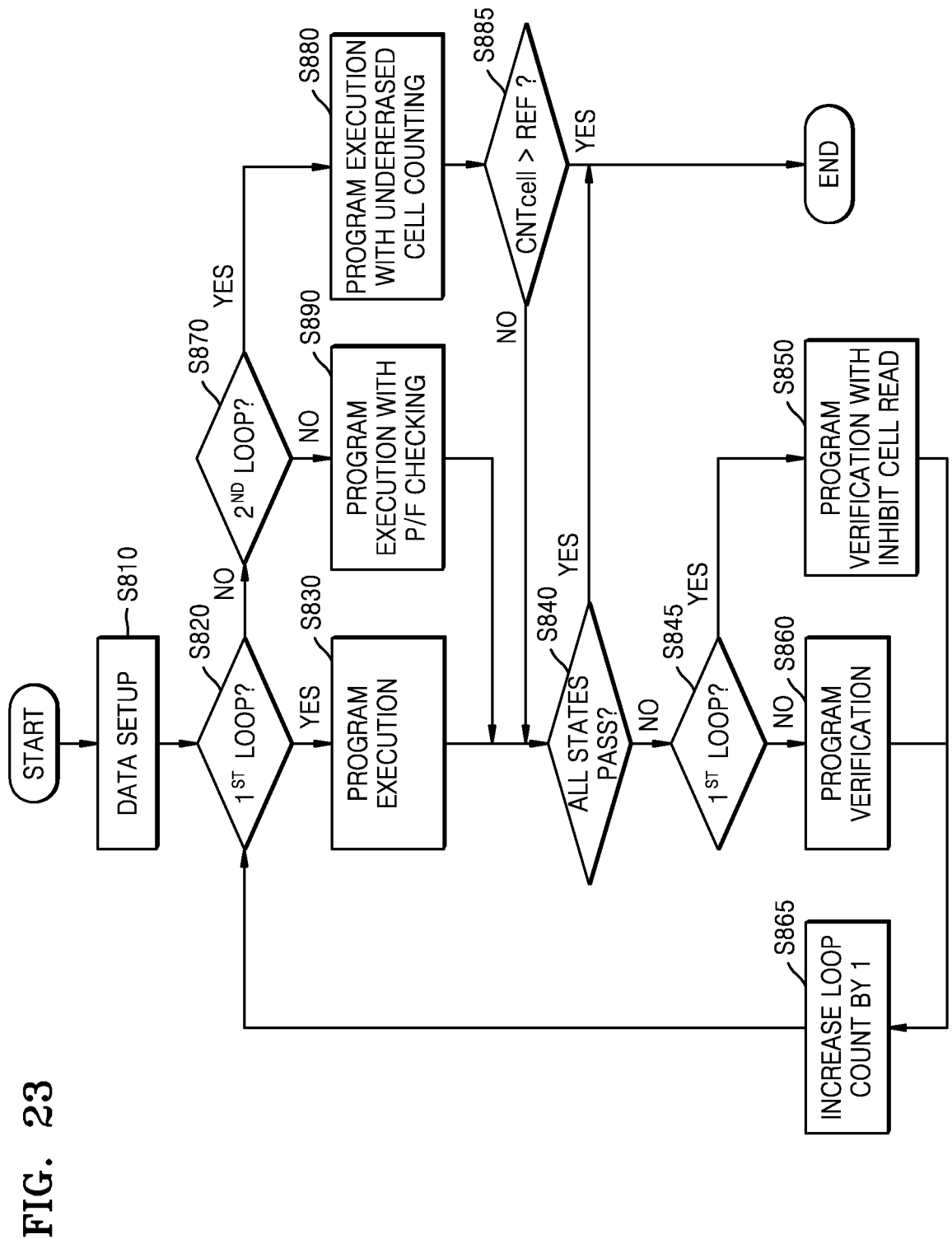
FIG. 23 is a flowchart illustrating a program method of a memory device according to an embodiment.
Figure 24:
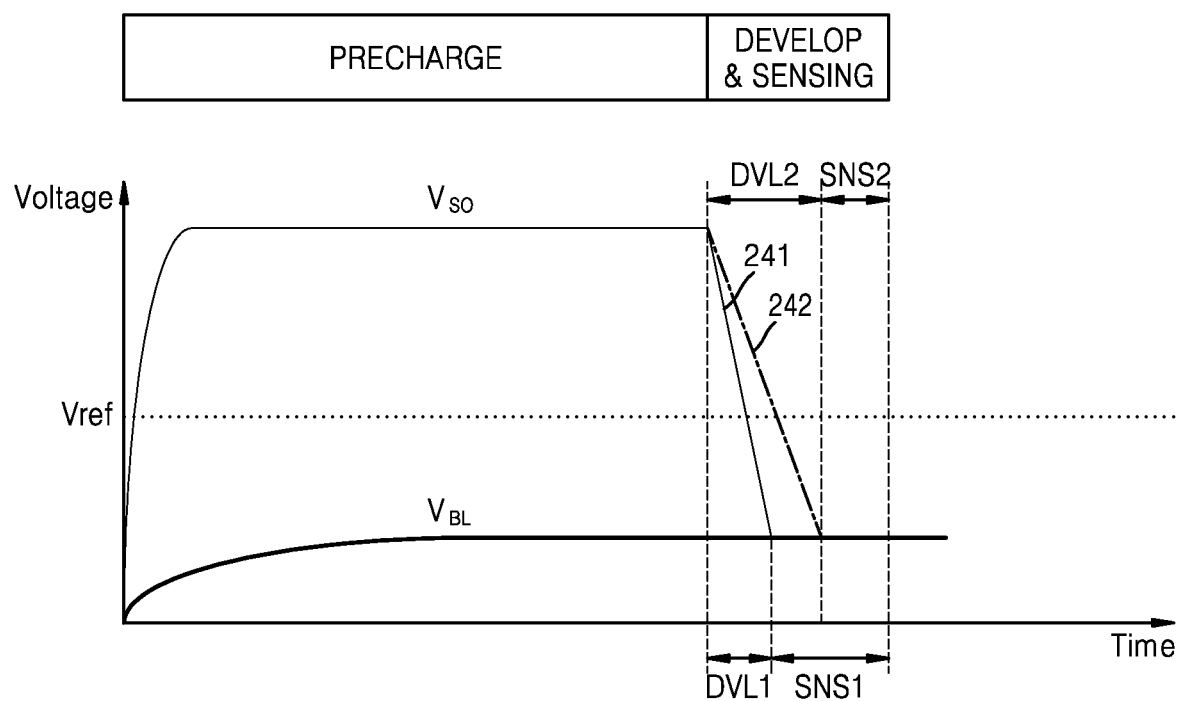
FIG. 24 is a timing diagram for describing an example of an operation of a page buffer unit of FIG. 22, based on the program method of FIG. 23.
Figure 25A:
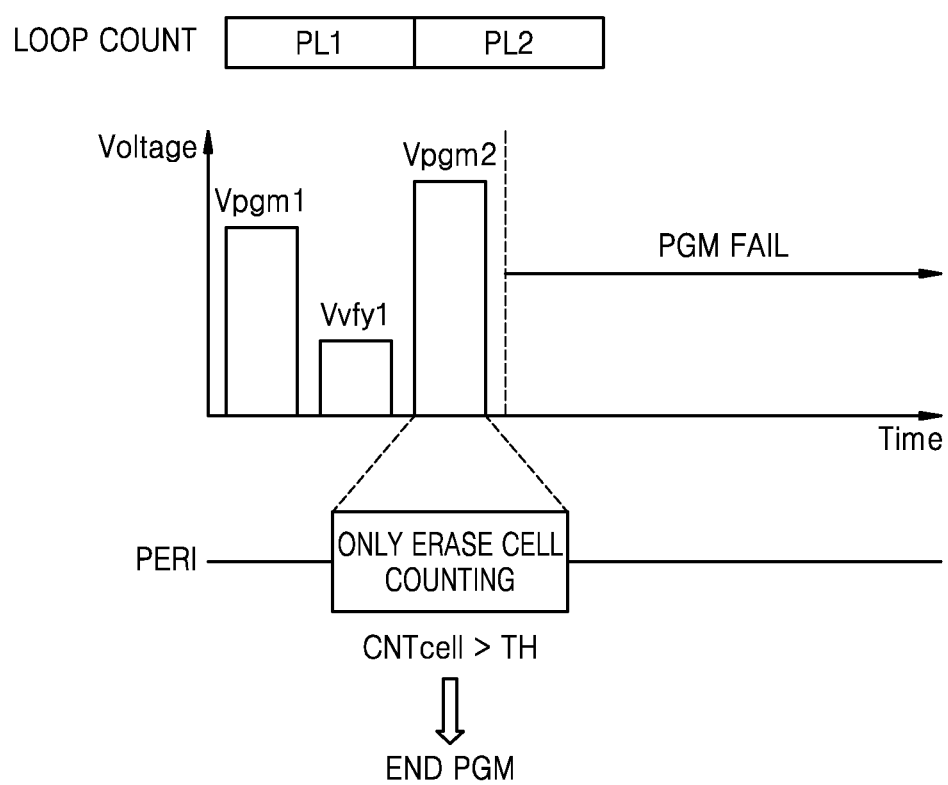
FIGS. 25A and 25B are timing diagrams showing the program method of FIG. 23.
Figure 25B:
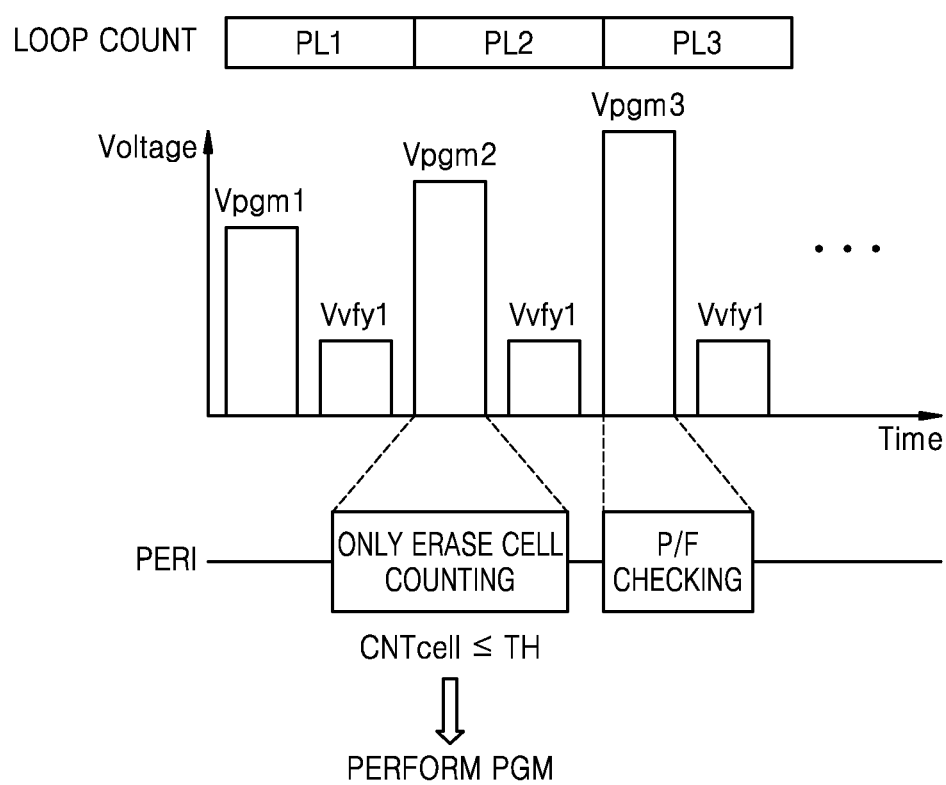

FIG. 23 is a flowchart illustrating a program method of a memory device according to an embodiment. FIG. 24 is a timing diagram for describing an example of an operation of a page buffer unit of FIG. 22, based on the program method of FIG. 23. FIGS. 25A and 25B are timing diagrams showing the program method of FIG. 23. The operating method according to an embodiment, for example, may include processes which are time-serially performed by the memory device 100b of FIG. 22. Hereinafter, the program method according to an embodiment will be described with reference to FIGS. 23 to 25B. The program method may correspond to an implementation example of FIG. 19, and descriptions given above with reference to FIGS. 19 to 21 may be applied to the embodiment.

In operation S810, a data setup operation may be performed. In operation S820, the memory device may determine whether a loop count is a first program loop PL1. When the loop count is determined to be the first program loop PL1, in operation S830, the memory device may apply a first program pulse Vpgm1 to a selected word line to perform programming. In operation S840, the memory device may determine whether a program operation is passed on all program states. When the program operation is determined to be passed on all program states, a program operation may end, and otherwise, operation S845 may be performed. In operation S845, the memory device may determine whether the loop count is the first program loop PL1.

When the loop count is determined to be the first program loop PL1, in operation S850, the memory device may perform a program verify operation on programmed memory cells by using a first program verify voltage Vvfy1, and simultaneously, may perform an erase detect operation for program-inhibited memory cells. For example, a program verify interval where the first program verify voltage Vvfy1 is applied to the selected word line may correspond to a precharge interval, a develop interval, and a sensing interval. In the precharge interval, the first and second bit lines BL1 and BL2 may be precharged with a certain bit line voltage, and the first and second sensing nodes SO1 and SO2 may be precharged with a precharge voltage (for example, Vpre2 of FIG. 20A).

In the develop interval, the first page buffer 121 connected to the programmed memory cell MC1 may differ from the second page buffer 122 connected to the program-inhibited memory cell MC2. In an embodiment, the second sensing node SO2 connected to the program-inhibited memory cell MC2 may be developed during a first develop time DVL1. In an embodiment, the first sensing node SO1 connected to the programmed memory cell MC1 may be developed during a second develop time DVL2. In an embodiment, the second develop time DVL2 may be longer than the first develop time DVL1.

First, an erase detect operation on the second sensing node SO2 connected to the program-inhibited memory cell MC2 will be described. For example, if a voltage of the second sensing node SO2 corresponds to a solid-line graph 241, the voltage of the second sensing node SO2 may be dropped to a reference voltage Vref or less during the first develop time DVL1, and thus, the program-inhibited memory cell MC2 may be sensed as an on cell. Also, if the voltage of the second sensing node SO2 corresponds to a dotted-line graph 242, the voltage of the second sensing node SO2 may not be dropped to the reference voltage Vref or less during the first develop time DVL1, and thus, the program-inhibited memory cell MC2 may be sensed as an undererased cell.

Next, a program verify operation on the first sensing node SO1 connected to the programmed memory cell MC1 will be described. For example, if a voltage of the first sensing node SO1 corresponds to the solid-line graph 241, the voltage of the first sensing node SO1 may be dropped to the reference voltage Vref or less during the second develop time DVL2, and thus, the programmed memory cell MC1 may be sensed as an on cell. Also, if the voltage of the first sensing node SO1 corresponds to the dotted-line graph 242, the voltage of the first sensing node SO1 may be dropped to the reference voltage Vref or less during the second develop time DVL2, and thus, the programmed memory cell MC1 may be sensed as an on cell.

As described above, according to the embodiment, the second develop time DVL2 for a program verify operation on programmed memory cells may be longer than the first develop time DVL1 for an erase detect operation on program-inhibited memory cells, and thus, memory cells, having a threshold voltage lower than the first program verify voltage Vvfy1, of the program-inhibited memory cells may be determined as undererased cells. Accordingly, the same effect as application of an erase detect voltage lower than the first program verify voltage Vvfy1 for the erase detect operation is obtained.

In operation S865, a loop count may increase by one. In operation S810, whether the loop count is the first program loop PL1 may be determined, and in operation S870, whether the loop count is the second program loop PL2 may be determined. When the loop count is determined to be the second program loop PL2, in operation S880, programming may be performed by applying the second program pulse Vpgm2 to a selected word line, and simultaneously, the number of undererased cells may be counted. In operation S885, the memory device may determine whether the counted number of the undererased cells CNTcell is greater than a reference bit count REF. When the counted number of the undererased cells CNTcell is determined to be greater than the reference bit count REF, as illustrated in FIG. 25A, the memory device may end a program operation and may process a memory block as a fail block. When the counted number of the undererased cells CNTcell is determined to be less than or equal to the reference bit count REF, operation S840 may be performed, and as illustrated in FIG. 25B, the memory device may continuously perform the program operation.

In operation S840, the memory device may determine whether a program operation is passed on all program states. When the program operation is determined to be passed on all program states, the program operation may end, and otherwise, operation S845 may be performed. When the loop count is determined to be the second program loop PL2, in operation S860, the memory device may sequentially apply a plurality of program verify voltages Vvfy to the selected word line to perform a program verify operation on each of the program states. In operation S865, the loop count may increase by one. In operation S820, whether the loop count is the first program loop PL1 may be determined, and in operation S870, whether the loop count is the second program loop PL2 may be determined. When the loop count is determined to be the third program loop PL3, in operation S890, the memory device may apply a third program pulse Vpgm3 to the selected word line to perform programming, and simultaneously, may check a pass/fail of the program operation.

Figure 26:
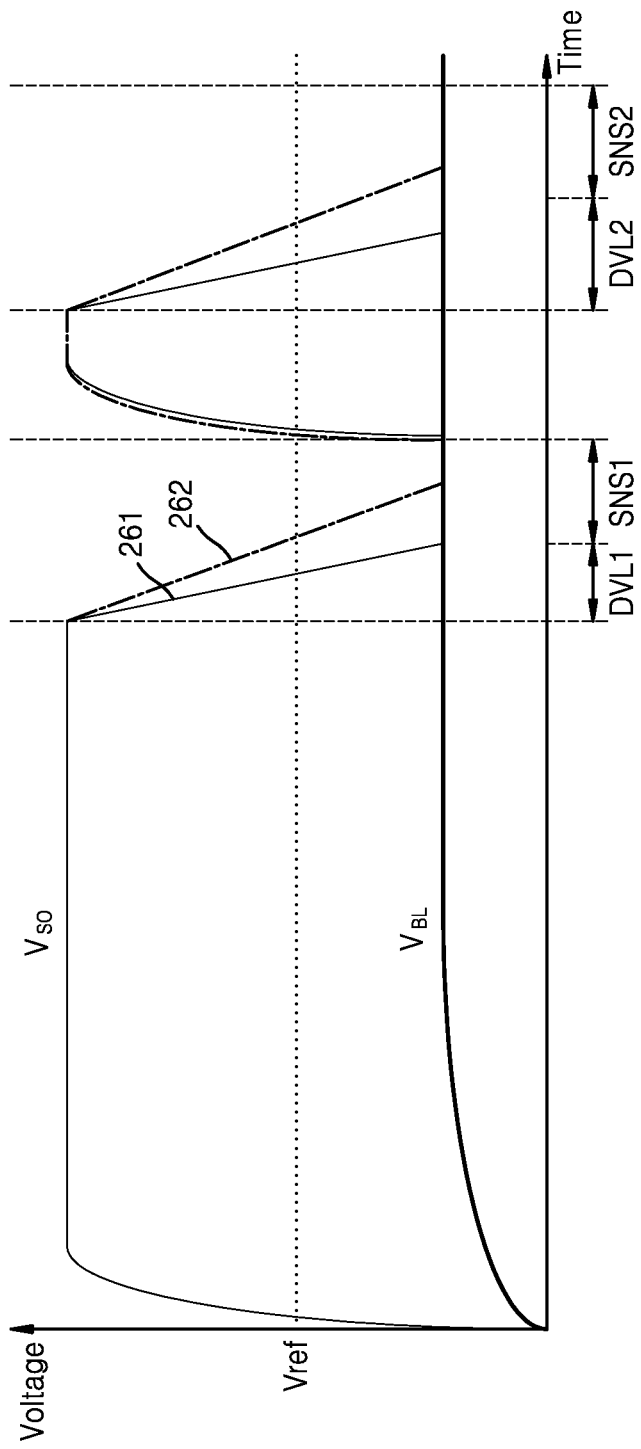
FIG. 26 is a timing diagram for describing an example of an operation of the page buffer unit of FIG. 22, based on the program method of FIG. 23.

FIG. 26 is a timing diagram for describing an example of an operation of the page buffer unit of FIG. 22, based on the program method of FIG. 23. Hereinafter, an operation of the page buffer unit will be described with reference to FIGS. 23 and 26. In an embodiment, by using the first program verify voltage Vvfy1, a program verify operation may be performed on programmed memory cells, and simultaneously, an erase detect operation may be performed on program-inhibited memory cells. For example, a program verify interval where the first program verify voltage Vvfy1 is applied to a selected word line may correspond to a first precharge interval, a first develop interval, a first sensing interval, a second precharge interval, a second develop interval, and a second sensing interval. In the first precharge interval, the first and second bit lines BL1 and BL2 may be precharged with a certain bit line voltage, and the first and second sensing nodes SO1 and SO2 may be precharged with a precharge voltage (for example, Vpre2 of FIG. 20A).

In the first develop interval, the first and second sensing nodes SO1 and SO2 may be developed during the first develop time DVL1. For example, data sensed through the first sensing node SO1 may be stored in a first sensing latch included in the latch 1213, and data sensed through the second sensing node SO2 may be stored in a first sensing latch included in the latch 1223. In the first sensing interval, in each of the latches 1213 and 1223, a data latch may be set based on the data stored in the first sensing latch. In the second precharge interval, the first and second sensing nodes SO1 and SO2 may be precharged with the precharge voltage Vpre2.

In the second develop interval, the first and second sensing nodes SO1 and SO2 may be developed during the second develop time DVL2. In this case, the second develop time DVL2 may be longer than the first develop time DVL1. For example, data sensed through the first sensing node SO1 may be stored in a second sensing latch included in the latch 1213, and data sensed through the second sensing node SO2 may be stored in a second sensing latch included in the latch 1223. In this case, one of a plurality of latches may be used as the second sensing latch. In the second sensing interval, in each of the latches 1213 and 1223, a data latch may be set based on the data stored in the second sensing latch.

In an embodiment, the first page buffer 121 connected to the programmed memory cell MC1 may determine a program pass/fail, based on the data stored in the second sensing latch. In an embodiment, the second page buffer 122 connected to the program-inhibited memory cell MC2 may perform the erase detect operation, based on the data stored in the first sensing latch. Therefore, even when the same first program verify voltage Vvfy1 is applied to the selected word line, a result where the program verify operation is performed on programmed memory cells and the erase detect operation is performed on program-inhibited memory cells is obtained.

Figure 27:
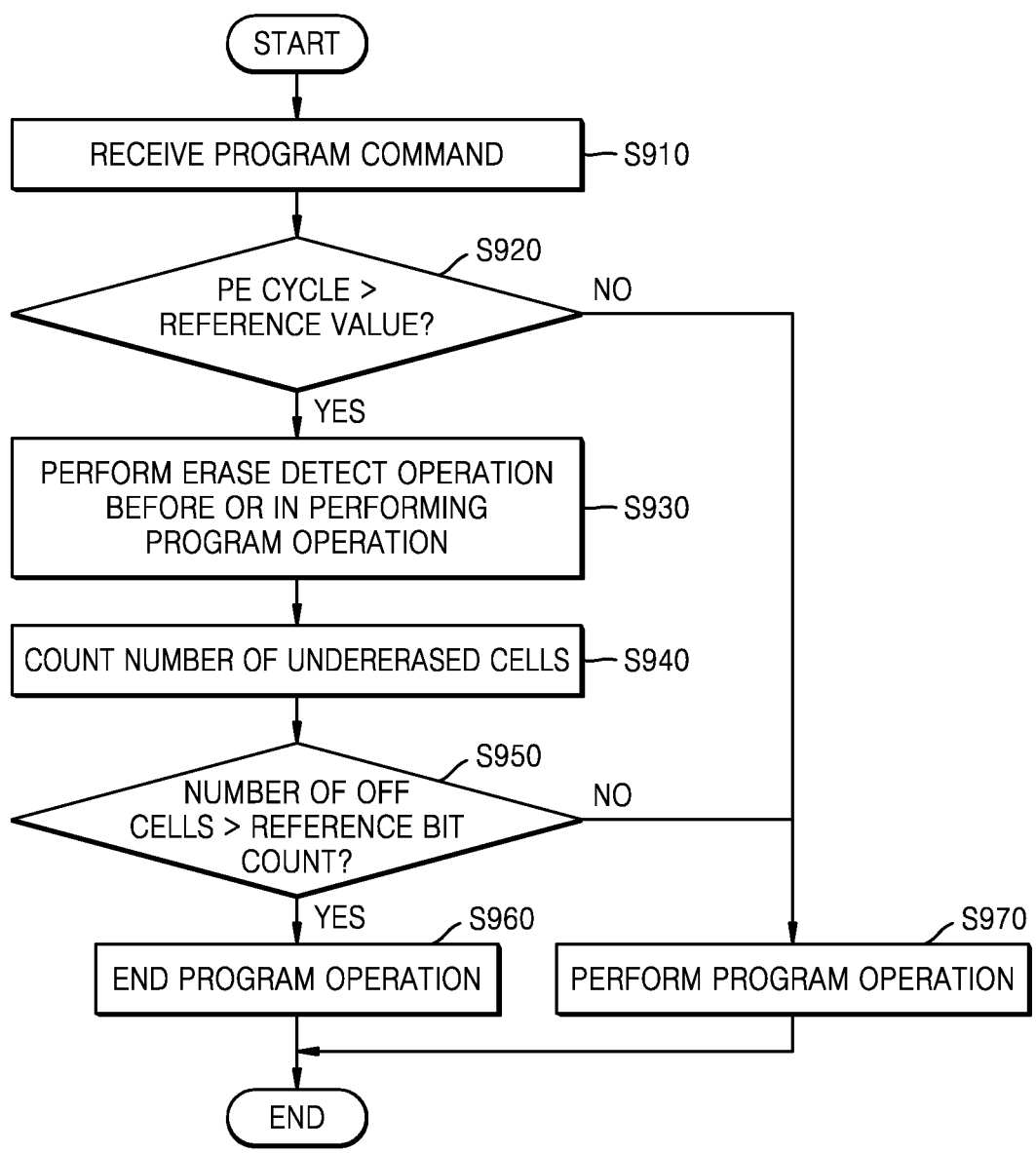
FIG. 27 is a flowchart illustrating an operating method of a memory device according to an embodiment.

FIG. 27 is a flowchart illustrating an operating method of a memory device according to an embodiment. Referring to FIG. 27, the operating method according to an embodiment may correspond to a method which checks a defective word line by performing an erase detect operation in a program operation of the memory device, and for example, may include processes which are time-serially performed by the memory device 100*a* of FIG. 14. Descriptions given above with reference to FIGS. 1 to 26 may be applied to the embodiment.

In operation S910, the memory device may receive a program command. In operation S920, the memory device may determine whether a program/erase cycle is greater than a reference value. When the program/erase cycle is determined to be greater than the reference value, operation S930 may be performed, and otherwise, operation S970 may be performed. In operation S930, an erase detect operation may be performed before or in the middle of performing a program operation. In operation S940, the number of undererased cells may be counted. In operation S950, the memory device may determine whether the number of the undererased cells is greater than a reference bit count. When the number of the undererased cells is determined to be greater than the reference bit count, operation S960 may be performed, and otherwise, operation S970 may be performed.

Figure 28:
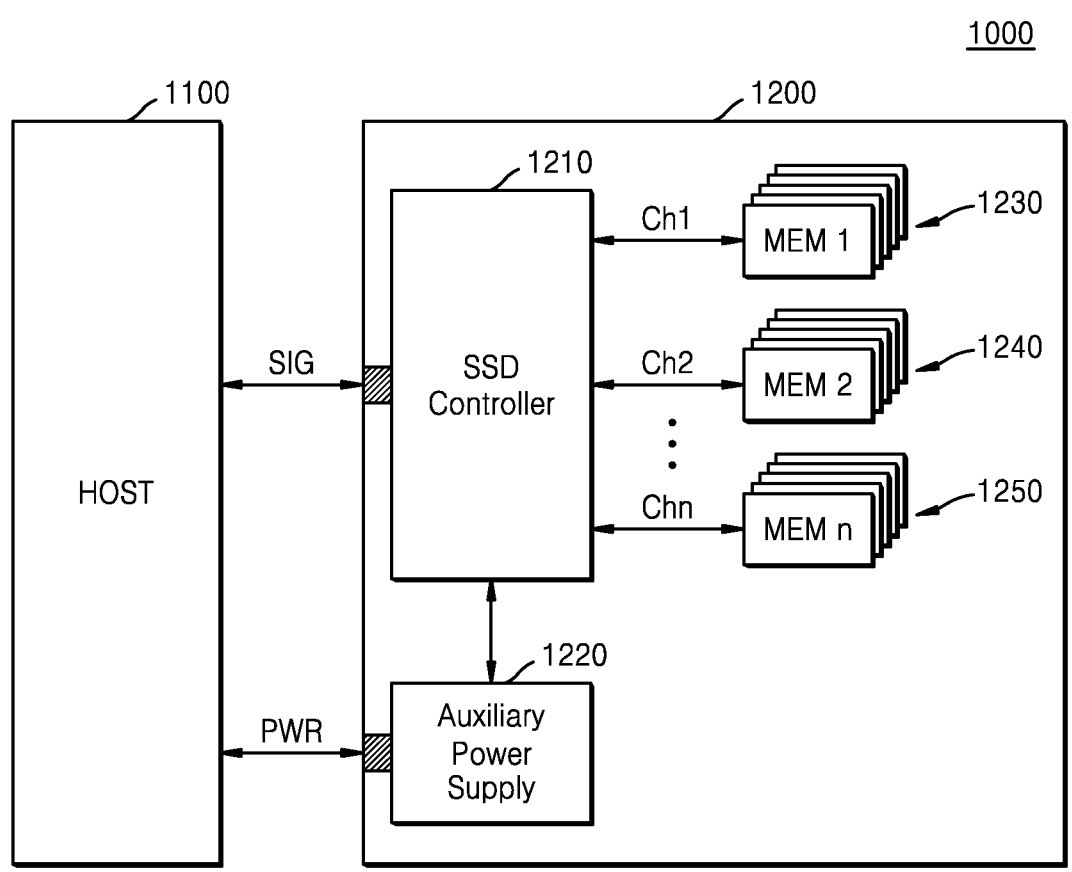
FIG. 28 is a block diagram illustrating an example where a memory device according to embodiments is applied to a solid state drive (SSD) system.

FIG. 28 is a block diagram illustrating an example where a memory device according to embodiments is applied to an SSD system 1000. Referring to FIG. 28, the SSD system 1000 may include a host 1100 and an SSD 1200. The SSD 1200 may transmit or receive a signal to or from the host 1100 through a signal connector and may be supplied with power through a power connector. The SSD 1200 may include an SSD controller 1210, an auxiliary power supply 1220, and a plurality of memory devices 1230, 1240, and 1250. The memory devices 1230, 1240, and 1250 may each be a vertically stacked NAND flash memory. In this case, the SSD 1200 may be implemented by using the embodiments described above with reference to FIGS. 1 to 27.

While inventive concepts have been particularly shown and described with reference to embodiments thereof, it will be understood that various changes in form and details may be made therein without departing from the spirit and scope of the following claims.

What is claimed is:

1. An operating method of a non-volatile memory device including a plurality of memory cells respectively connected to a plurality of word lines, the operating method comprising:
    in response to a program command, applying an erase detect voltage to a selected word line of the plurality of word lines to perform an erase detect operation on the memory cells connected to the selected word line;
    after the erase detect operation, applying a program voltage to the selected word line; and
    counting a number of undererased cells of the memory cells on which the erase detect operation has been performed.

2. The operating method of claim 1, further comprising, in response to the number of the undererased cells being greater than a reference bit count, ending a program operation triggered by the program command.

3. The operating method of claim 1, further comprising, in response to the number of the undererased cells being greater than a reference bit count, processing a memory block connected to the selected word line as a fail block.

4. The operating method of claim 1, wherein a voltage level of the erase detect voltage is less than a verify voltage level having a lowest program state for the memory cells.

5. The operating method of claim 1, wherein a voltage level of the erase detect voltage is greater than a verify voltage level having an erase state for the memory cells.

6. The operating method of claim 1, wherein
    a voltage level of the erase detect voltage is the same as a verify voltage of a lowest program state for the memory cells, and
    a develop time of a sensing node in the erase detect operation is shorter than a develop time of a sensing node in a verify operation having the lowest program state.

7. The operating method of claim 1, wherein the counting is performed substantially simultaneously with the applying of the program voltage.

8. The operating method of claim 1, further comprising, after the applying of the program voltage, applying a program verify voltage to the selected word line.

9. The operating method of claim 1, wherein
    a program operation triggered by the program command includes a plurality of program loops which are sequentially performed, and each of the plurality of program loops includes a program perform interval and a program verify interval after the program perform interval, and
    the counting is performed in a program perform interval of a first program loop of the plurality of program loops.

10. The operating method of claim 1, further comprising:
    receiving the program command, the receiving of the program command including
    receiving a first program command, an address, and least significant bit (LSB) data, and
    receiving a second program command, the address, and most significant bit (MSB) data,
    wherein the performing of the erase detect operation is performed after the receiving of the first program command.

11. An operating method of a non-volatile memory device including a plurality of memory cells respectively connected to a plurality of word lines, the operating method comprising:
- in response to a program command, applying a program voltage to a selected word line of the plurality of word lines;
- after the applying of the program voltage, applying an erase detect voltage to the selected word line to perform an erase detect operation on program-inhibited memory cells of memory cells connected to the selected word line; and
- counting a number of undererased cells of the program-inhibited memory cells on which the erase detect operation has been performed.

12. The operating method of claim 11, further comprising, in response to the number of the undererased cells being greater than a reference bit count, ending a program operation triggered by the program command.

13. The operating method of claim 11, further comprising:
- after the performing of the erase detect operation, applying a program verify voltage to the selected word line to perform a program verify operation on programmed memory cells of the memory cells connected to the selected word line.

14. The operating method of claim 11, further comprising:
- after the applying of the program voltage and before the performing of the erase detect operation, applying a program verify voltage to the selected word line to perform a program verify operation on programmed memory cells of the memory cells connected to the selected word line.

15. The operating method of claim 11, further comprising applying an additional program voltage, having a voltage level greater than the program voltage, to the selected word line,
- wherein the counting is performed substantially simultaneously with the applying of the additional program voltage.

16. An operating method of a non-volatile memory device including a plurality of memory cells respectively connected to a plurality of word lines, the operating method comprising:
- in response to a program command, applying a program voltage to a selected word line of the plurality of word lines;
- using a program verify voltage, performing a program verify operation on programmed memory cells of memory cells connected to the selected word line;
- using the program verify voltage, performing an erase detect operation on program-inhibited memory cells of the memory cells connected to the selected word line; and
- counting a number of undererased cells of the program-inhibited memory cells on which the erase detect operation has been performed.

17. The operating method of claim 16, further comprising, in response to the number of the undererased cells is greater than a reference bit count, ending a program operation triggered by the program command.

18. The operating method of claim 16, wherein
- in the erase detect operation, a develop interval for the program-inhibited memory cells corresponds to a first develop time, and
- in the program verify operation, a develop interval for the programmed memory cells corresponds to a second develop time, longer than the first develop time.

19. The operating method of claim 16, wherein the program-inhibited memory cells include memory cells where a target state is an erase state.

20. The operating method of claim 16, further comprising applying an additional program voltage, which is greater than the program voltage, to the selected word line,
- wherein the counting is performed substantially simultaneously with the applying of the additional program voltage.

* * * * *